US012733357B2

(12) United States Patent
Kang et al.

(10) Patent No.: US 12,733,357 B2
(45) Date of Patent: Sep. 8, 2026

(54) DISPLAY DEVICE HAVING MULTILAYER FILM EXPOSING POWER LINE AND METHOD OF MANUFACTURING THE SAME

(71) Applicant: Samsung Display Co., Ltd., Yongin-Si (KR)

(72) Inventors: Donghan Kang, Yongin-si (KR); Jeehoon Kim, Yongin-si (KR); Sunggwon Moon, Yongin-si (KR); Seungsok Son, Yongin-si (KR); Shinhyuk Yang, Yongin-si (KR); Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 398 days.

(21) Appl. No.: 18/199,228

(22) Filed: May 18, 2023

(65) Prior Publication Data

US 2024/0114732 A1 Apr. 4, 2024

(30) Foreign Application Priority Data

Sep. 29, 2022 (KR) ........................ 10-2022-0124017

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/123* (2023.02); *H10K 59/873* (2023.02)

(58) Field of Classification Search
CPC ............. H10K 59/131; H10K 59/1201; H10K 59/123; H10K 59/873; H10K 59/124; H10K 59/1315; H10K 59/80522; H10K 50/844; H10K 50/11; H10K 50/82; H10K 71/00; H10K 71/10; H10K 71/231;
(Continued)

(56) References Cited

U.S. PATENT DOCUMENTS 9,792,867 B2 * 10/2017 Ohishi .................. G02F 1/1345
10,361,223 B2 * 7/2019 Kim ..................... H10D 89/911
(Continued)

FOREIGN PATENT DOCUMENTS

KR 10-2021-0014233 A 2/2021
KR 10-2021-0086869 A 7/2021
(Continued)

*Primary Examiner* — Caleb E Henry
(74) *Attorney, Agent, or Firm* — Innovation Counsel LLP

(57) ABSTRACT

Provided is a display device including a substrate including a display area and a contact area located in a display area, a power line disposed in a display area on a substrate and overlapping a contact area, a passivation layer disposed on a substrate and a power line, and an opening exposing at least a portion of an upper surface of a power line in a contact area defined in a passivation layer, a via insulation layer disposed on a passivation layer, including a via contact hole connected to an opening in a contact area, and including a protrusion protruding toward a center of a via contact hole, and a common electrode disposed on a via insulation layer and a power line and electrically connected to a power line in a contact area.

20 Claims, 23 Drawing Sheets

(51) Int. Cl.
*H10K 59/123* (2023.01)
*H10K 59/80* (2023.01)

(58) Field of Classification Search
CPC ............. H10K 2102/351; H10K 59/40; H10K 59/1213; G06F 3/0412; G06F 3/04164; G06F 3/0443; G06F 2203/04107; G06F 2203/04111; G06F 2203/04103; G06F 3/041; G06F 3/147; G06F 3/1446; H01L 25/18; H01L 23/60; H01L 27/0248; H01L 27/3293; H01L 51/0097; H01L 2251/5338; H01L 27/3276; Y02E 10/549; G09G 2300/026; G09G 2380/02; G09G 3/32; G09G 2300/0426
See application file for complete search history.

(56) References Cited

U.S. PATENT DOCUMENTS

| | | | | |
|---|---|---|---|---|
| 10,403,845 | B2 | 9/2019 | Lee et al. | |
| 10,503,297 | B2 * | 12/2019 | Zeng | H04M 1/0266 |
| 10,575,403 | B2 * | 2/2020 | Park | G02F 1/1333 |
| 11,296,157 | B2 * | 4/2022 | Won | G06F 3/0443 |
| 11,552,157 | B2 * | 1/2023 | Son | H10K 59/124 |
| 11,563,074 | B2 | 1/2023 | Cho et al. | |
| 2007/0291042 | A1 * | 12/2007 | Kwak | G09G 3/3688 345/535 |
| 2007/0296659 | A1 * | 12/2007 | Kwak | G02F 1/13452 349/56 |
| 2013/0228867 | A1 * | 9/2013 | Suematsu | H01L 23/60 257/355 |
| 2014/0117998 | A1 * | 5/2014 | Hwang | G09G 3/006 324/511 |
| 2014/0217373 | A1 * | 8/2014 | Youn | H10K 59/805 438/23 |
| 2014/0376135 | A1 * | 12/2014 | Huo | H10D 89/711 361/56 |
| 2015/0036300 | A1 * | 2/2015 | Park | H05K 1/147 156/212 |
| 2015/0103500 | A1 * | 4/2015 | Bae | H05K 1/111 228/102 |
| 2015/0270287 | A1 * | 9/2015 | Kim | H10D 86/441 257/40 |
| 2016/0043341 | A1 | 2/2016 | Heo et al. | |
| 2016/0172428 | A1 * | 6/2016 | Song | H10K 59/131 257/40 |
| 2017/0069616 | A1 * | 3/2017 | Cai | H10D 84/135 |
| 2017/0179112 | A1 * | 6/2017 | Narita | H01L 23/5221 |
| 2018/0301520 | A1 * | 10/2018 | Jin | H10D 86/441 |
| 2019/0172898 | A1 | 6/2019 | Choi | |
| 2019/0179591 | A1 * | 6/2019 | Kuo | G06F 3/1446 |
| 2019/0207168 | A1 | 7/2019 | Lee et al. | |
| 2019/0281699 | A1 * | 9/2019 | Bae | H05K 1/111 |
| 2019/0346953 | A1 * | 11/2019 | Peng | G09G 3/20 |
| 2020/0312236 | A1 * | 10/2020 | Ma | G09G 3/3225 |
| 2021/0036076 | A1 | 2/2021 | Kim et al. | |
| 2021/0202662 | A1 * | 7/2021 | Jo | H10K 59/131 |
| 2021/0249451 | A1 | 8/2021 | Kim et al. | |
| 2022/0102471 | A1 * | 3/2022 | Jang | H10K 59/80522 |
| 2022/0165980 | A1 | 5/2022 | Shim et al. | |
| 2022/0208909 | A1 * | 6/2022 | Jeon | H10K 59/18 |
| 2022/0208946 | A1 * | 6/2022 | Kim | H10K 59/1315 |
| 2022/0208951 | A1 * | 6/2022 | Yoo | H10K 59/18 |
| 2022/0208952 | A1 * | 6/2022 | Shin | H10K 59/131 |
| 2024/0221650 | A1 * | 7/2024 | Son | G09G 3/20 |

FOREIGN PATENT DOCUMENTS

| | | | |
|---|---|---|---|
| KR | 10-2021-0101353 | A | 8/2021 |
| KR | 10-2022-0069361 | A | 5/2022 |
| KR | 10-2022-0079173 | A | 6/2022 |
| KR | 10-2022-0081071 | A | 6/2022 |
| KR | 10-2022-0110471 | A | 8/2022 |

* cited by examiner

DD
GRV1
VCNT1
CNT2
PDL
VIA
CA
GRV2
OP
VCNT2
TFE
IEL2
OEL
IEL1
LED
CTE
EL
ADE
CNT1
GI
UC
PVX
ILD
BFR
SUB
I
I'
CE1
ACT
GAT1
CE2
BML
TR
BML
GAT2
CL1
CL2
GI
VL
PE
DA
PA
D3
D2
D1
MLF:PVX,VIA

DD
PVX
ILD
BFR
SUB
I'
I
MLF:PVX,VIA
CNT1
PE
PA
CNT3
CA
GI
CL2
CL1
GAT2
VL
BML
DA
CNT2
GI
CE2
GAT1
ACT
CE1
TR
D1
D2
D3

DD
VIA-A
PVX
ILD
BFR
SUB
I'
I
MLF:PVX,VIA
CNT1
PE
PA
CNT3
CA
GI
CL2
CL1
GAT2
VL
BML
DA
CNT2
CE2
GAT1
ACT
CE1
TR
D1
D2
D3

DD
PI
CNT1
PE
T12
PVX
ILD
BFR
SUB
I'
PA
MLF:PVX, VIA
T11
VCNT2
CNT3
CA
VIA
GI
CL2
CL1
GAT2
BML
VL
DA
GRV1
VCNT1
CNT2
CE2
GAT1
ACT
CE1
TR
I
D1
D2
D3

DD
GRV1
VCNT1
CNT2
VIA
CA
GRV2
OP
VCNT2
CNT1
GI
UC
PI
PVX
ILD
BFR
SUB
I
I'
CE1 ACT GAT1 CE2 BML
TR
BML GAT2 CL1 CL2 GI
VL
PE
DA
PA
D3
D2
D1
MLF:PVX,VIA

DD
PI
PVX
ILD
BFR
SUB
I'
MLF:PVX, VIA
CNT1
PE
PA
GRV2
OP
VCNT2
GI
CL2
CL1
VL
GAT2
BML
CA
VIA
UC
DA
GRV1
VCNT1
CNT2
BML
CE2
GAT1
GI
ACT
CE1
TR
ADE
I
D1
D3
D2

DD
PVX
ILD
BFR
SUB
I'
CNT1
PE
PA
MLF:PVX, VIA
GRV2
VCNT2
OP
CA
VIA
UC
GI
CL2
CL1
GAT2
BML
VL
DA
GRV1
VCNT1
CNT2
CE2
GAT1
ACT
CE1
TR
ADE
I
D1
D2
D3

DD
PVX
ILD
BFR
SUB
I'
CNT1
PE
PA
MLF:PVX, VIA
GRV2
OP VCNT2
CA
VIA
PDL
GRV1
VCNT1 CNT2
GI
UC
BML GAT2 CL1 CL2
VL
GI
BML
CE2
CE1 ACT GAT1
TR
DA
EL
ADE
I
D1
D3
D2

DD
GRV1
VCNT1
CNT2
PDL
VIA
CA
GRV2
OP
VCNT2
LED
CTE
EL
ADE
GI
UC
CNT1
PVX
ILD
BFR
SUB
I
I'
CE1
ACT
GAT1
CE2
BML
TR
BML
GAT2
CL1
CL2
GI
VL
PE
D3
D2
D1
DA
PA
MLF:PVX,VIA

GRV1
VCNT1
CNT2
PDL
VIA
CA
GRV2
OP
VCNT2
DD1
IEL2
OEL
IEL1
TFE
CTE
EL
ADE
LED
CNT1
GI
UC
PVX
ILD
BFR
SUB
I
I'
CE1
ACT
GAT1
CE2
BML
TR
BML
GAT2
CL1
CL2
GI
VL
PE
D3
D2
D1
DA
PA
MLF:PVX,VIA

DD2
PVX
ILD
BFR
SUB
I'
MLF:PVX,VIA
CNT1
PE
PA
CPE
GRV2
VCNT2
OP
CA
VIA
PDL
GRV1
CNT2
VCNT1
UC
GI
CL2
CL1
GAT2
BML
VL
DA
CE2
GAT1
ACT
CE1
TR
IEL2
OEL
IEL1
CTE
EL
ADE
TFE
LED
I
D3
D2
D1

DD3
PVX
ILD
BFR
SUB
I'
CNT1
PE
PA
MLF:PVX,VIA
CPE
GRV2
VCNT2
OP
CA
VIA
PDL
GRV1
CNT2
VCNT1
GI
CL2
CL1
VL
GAT2
BML
UC
DA
CE2
GAT1
ACT
CE1
TR
I
IEL2
OEL
IEL1
TFE
CTE
EL
ADE
LED
D3
D2
D1

DISPLAY DEVICE HAVING MULTILAYER FILM EXPOSING POWER LINE AND METHOD OF MANUFACTURING THE SAME

This application claims priority to Korean Patent Application No. 10-2022-0124017, filed on Sep. 29, 2022, and all the benefits accruing therefrom under 35 U.S.C. § 119, the content of which in its entirety is herein incorporated by reference.

BACKGROUND

1. Field

The present disclosure generally relates to a display device and method of manufacturing the display device. More particularly, the present disclosure relates to a display device capable of preventing a voltage drop and manufacturing the same.

2. Description of the Related Art

A display device includes light emitting devices, and the light emitting devices include a common electrode formed of a plate electrode. As the size of the display device increases, display quality of the display device may deteriorate due to a drop in voltage provided to the common electrode. Accordingly, a structure for preventing a voltage drop of the voltage provided to the common electrode is being developed.

SUMMARY

Embodiments provide a display device capable of preventing a voltage drop.

Embodiments provide a method for manufacturing the display device capable of preventing a voltage drop.

A display device according to an embodiment includes a substrate including a display area and a contact area located in the display area, a power line disposed in the display area on the substrate and overlapping the contact area, a passivation layer disposed on the substrate and the power line, and an opening exposing at least a portion of an upper surface of the power line in the contact are a defined in the passivation layer, a via insulation layer disposed on the passivation layer, including a via contact hole connected to the opening in the contact area, and including a protrusion protruding toward a center of the via contact hole, and, a common electrode disposed on the via insulation layer and the power line and electrically connected to the power line in the contact area.

In an embodiment, a multilayer film including the passivation layer and the via insulation layer may have an undercut shape in the contact area by a first side surface of the opening and the protrusion.

In an embodiment, a portion of the via insulation layer extends to an inside of the opening to cover the second side surface of the opening opposite to the first side surface.

In an embodiment, a first inclination angle of the first side surface with respect to the upper surface of the power line may be smaller than a second inclination angle of the second side surface with respect to the upper surface of the power line.

In an embodiment, a third inclination angle of a side surface of the via insulation layer with respect to the upper surface of the power line may be smaller than the second inclination angle.

In an embodiment, the passivation layer may include an inorganic insulation material, and the via insulation layer may include an organic insulation material.

In an embodiment, a length of the protrusion toward the center of the via contact hole may be about 0.1 micrometers to about 5.0 micrometers.

In an embodiment, the power line may include a first conductive layer and a second conductive layer disposed on the first conductive layer, the first conductive layer may include at least one selected from copper (Cu) and aluminum (Al), and the second conductive layer may include at least one selected from transparent conductive oxide, titanium (Ti), and molybdenum (Mo).

In an embodiment, the common electrode may be discontinued in the contact area by the protrusion.

In an embodiment, the common electrode may be connected entirely in the contact area.

In an embodiment, the display device may further include an emission layer discontinued in the contact area by the protrusion in the contact area.

In an embodiment, a thickness of the emission layer may be smaller than or equal to a thickness of the passivation layer.

In an embodiment, the common electrode may cover a side surface of the emission layer.

In an embodiment, the display device may further include a transistor disposed in the display area on the substrate, a pixel electrode disposed on the transistor and electrically connected to the transistor, and a capping electrode discontinued in the contact area by the protrusion and disposed on a same layer as the pixel electrode.

In an embodiment, an upper surface of the via insulation layer may include a first portion overlapping the pixel electrode and a second portion spaced apart from the pixel electrode, and a height of the first portion from an upper surface of the substrate may be greater than a height of the second portion from the upper surface of the substrate.

In an embodiment, the display device may further include a pad electrode disposed in a pad area located on one side of the display area on the substrate and disposed on a same layer as the power line, and the passivation layer may expose at least a portion of an upper surface of the pad electrode.

In an embodiment, the display device may further include an encapsulation layer disposed on the common electrode and including an inorganic encapsulation layer and an organic encapsulation layer, and the organic encapsulation layer may be disposed to fill an empty space between the power line and the protrusion.

A display device according to another embodiment includes a substrate including a display area and a contact area located in the display area, a power line disposed in the display area on the substrate and overlapping the contact area, and a multilayer film disposed on the substrate and the power line and exposing at least a portion of an upper surface of the power line in the contact area, the multilayer film includes a passivation layer, and an opening exposing at least a portion of the upper surface of the power line in the contact area defined in the passivation layer and a via insulation layer disposed on the passivation layer, including a via contact hole connected to the opening in the contact area, and including a protrusion protruding toward a center of the via contact hole, and the multilayer film includes an undercut shape in the contact area by a first side surface of the opening and the protrusion.

In an embodiment, a portion of the via insulation layer extends to an inside of the opening to cover the second side surface of the opening opposite to the first side surface.

In an embodiment, a first inclination angle of the first side surface with respect to the upper surface of the power line may be smaller than a second inclination angle of the second side surface with respect to the upper surface of the power line.

In an embodiment, a third inclination angle of a side surface of the via insulation layer with respect to the upper surface of the power line may be smaller than the second inclination angle.

In an embodiment, the passivation layer may include an inorganic insulation material, and the via insulation layer includes an organic insulation material.

In an embodiment, a length of the protrusion toward the center of the via contact hole may be about 0.1 micrometers to about 5.0 micrometers.

A method of manufacturing a display device according to an embodiment may include providing a power line in a display area on a substrate including a display area and a contact area located in the display area to overlap the contact area, providing a passivation layer including a contact hole exposing at least a porting of an upper surface of the power line in the contact area on the substrate and the power line, providing a preliminary via insulation layer on the power line and the passivation layer to cover the power line and the passivation layer, providing a via insulation layer including a via contact hole connected to the contact hole in the contact area by patterning the preliminary via insulation layer, removing a portion of the passivation layer overlapping the via insulation layer and the power line in the contact area so that the via insulation layer has a protrusion protruding toward a center of the via contact hole, and providing a common electrode electrically connected to the power line in the contact area on the power line and the via insulation layer.

In an embodiment, the portion of the passivation layer overlapping the via insulation layer and the power line may be removed through a wet etching process.

In an embodiment, after the removing the portion of the passivation layer, an opening including a width wider than a width of the contact hole is formed in the passivation layer, and an undercut shape in the contact area by a first side surface of the opening and the protrusion may be formed in the multilayer film including the passivation layer and the via insulation layer.

In an embodiment, in the providing the via insulation layer, a portion of the via contact hole may overlap the contact hole in a plan view, and the remaining portion may be spaced apart from the contact hole in a plan view.

In an embodiment, the passivation layer may be formed of an inorganic insulating material, and the via insulation layer may be formed of an organic insulating material.

In an embodiment, the method may further includes a step of providing a pad electrode in a pad area located on one side of the display area on the substrate before providing the passivation layer, the pad electrode may be formed together with the power line in a same process, and the passivation layer may expose at least a portion of an upper surface of the pad electrode.

In an embodiment, in the providing the preliminary via insulation layer, the preliminary via insulation layer may be formed to cover the pad electrode together with the power line and the passivation layer, and after the patterning the preliminary via insulation layer, a protective insulation layer disposed in the pad area on the substrate and covering the passivation layer may be formed together with the via insulation layer.

In an embodiment, the protective insulation layer may be integrally formed with the via insulation layer, and a thickness of the protective insulation layer may be smaller than a thickness of the via insulation layer.

In an embodiment, the via insulation layer and the protective insulation layer may be formed together by patterning the preliminary via insulation layer using a half-tone mask.

In an embodiment, the method may further include a step of removing the protective insulation layer after removing the portion of the passivation layer.

In an embodiment, the method may further include a step of providing an emission layer disposed on the power line and discontinued in the contact area by the protrusion before the providing the common electrode.

In an embodiment, a first angle at which the emission layer is deposited may be greater than a second angle at which the common electrode is deposited.

In an embodiment, the method may further include a step of providing a capping electrode disposed on the power line and disconnected in the contact area by the protrusion before the forming the common electrode.

In an embodiment, the method may further include steps of providing a transistor in the display area on the substrate before providing the preliminary passivation layer and providing a pixel electrode electrically connected to the transistor on the transistor after the forming the via insulation layer, and wherein the pixel electrode may be formed together with the capping electrode in the same process.

The display device according to embodiments may include a power line, a passivation layer, a via insulation layer, and a common electrode. In addition, the passivation layer may have an opening exposing a portion of the power line in a contact area, and the via insulation layer may have a via contact hole connected to the opening. Also, the via insulation layer may have a protrusion protruding toward a center of the via contact hole.

Accordingly, a multilayer film including the passivation layer and the via insulation layer may have an undercut shape in the contact area by one side surface of the opening and the protrusion. Accordingly, the common electrode may be electrically connected to the power line in the contact area. Accordingly, a voltage drop of the common voltage provided to the common electrode may be prevented.

It is to be understood that both the foregoing general description and the following detailed description are exemplary and explanatory and are intended to provide further explanation of the present disclosure as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
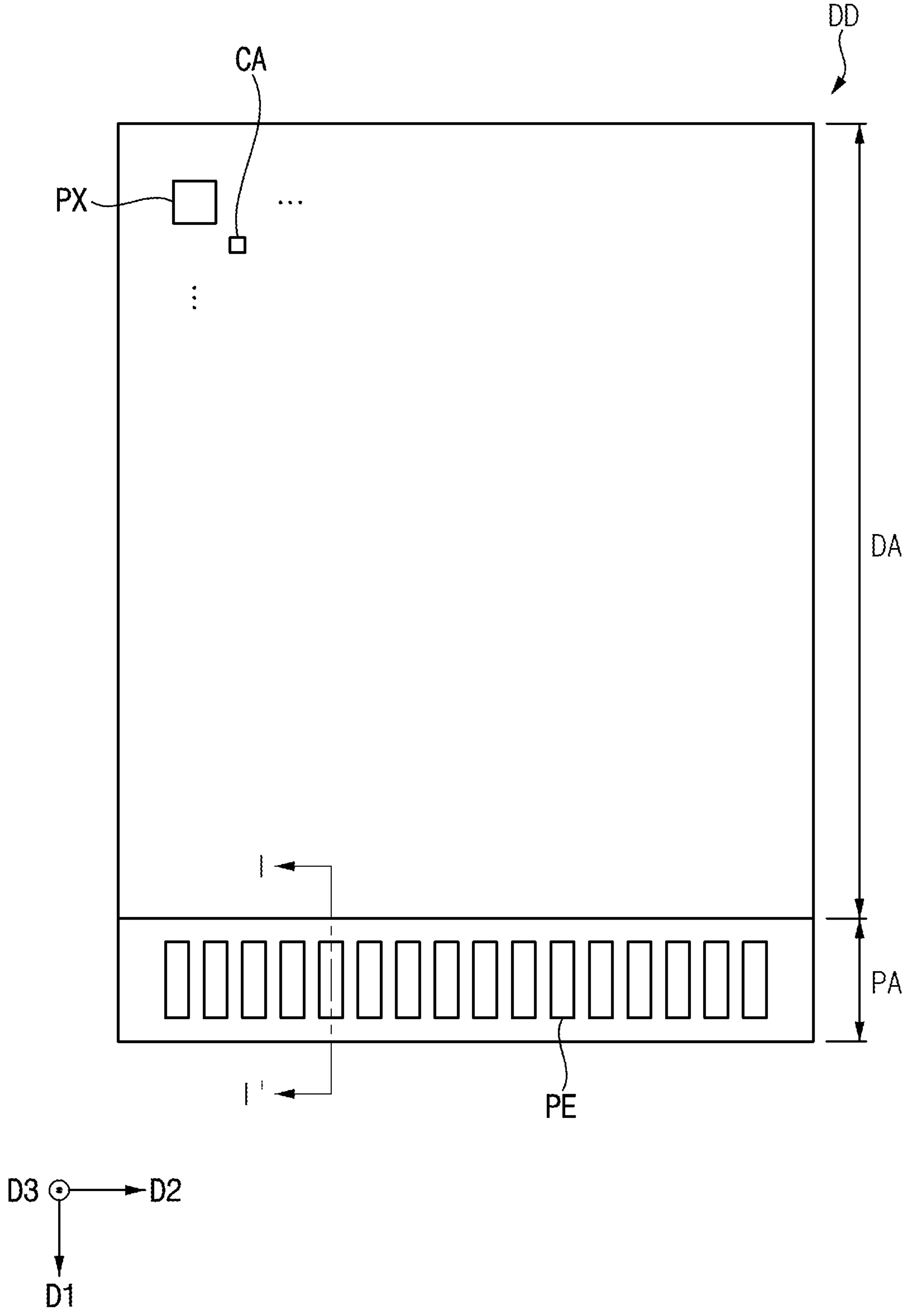
FIG. 1 is a plan view illustrating a display device according to an embodiment.

The present disclosure now will be described more fully hereinafter with reference to the accompanying drawings, in which various embodiments are shown. This present disclosure may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

FIG. 1 is a plan view illustrating a display device according to an embodiment.

Referring to FIG. 1, the display device DD (e.g., a substrate SUB of FIG. 4) may include a display area DA and a pad area PA. Pixel structures PX may be disposed in the display area DA. For example, the pixel structures PX may be entirely arranged in the display area DA along a first direction D1 and a second direction D2 orthogonal to the first direction D1.

Each of the pixel structures PX may include a light emitting device generating light and a transistor driving the light emitting device. For example, the light emitting device may include an organic light emitting diode. For another example, the light emitting device may include a nano light emitting diode. For example, the transistor may be a thin film transistor (TFT). An image may be displayed on the display area DA of the display device DD through the pixel structures PX including the light emitting device and the transistor.

In an embodiment, a contact area CA may be located in the display area DA. In an embodiment, the contact area CA may be located adjacent to the pixel structures PX. In the present specification, the contact area CA may be defined as an area where a portion of a passivation layer (e.g., the passivation layer PVX of FIG. 4) and/or a portion of a via insulation layer (e.g., the via insulation layer VIA of FIG. 4) disposed on a power line VL is patterned to electrically connect a common electrode (e.g., the common electrode CTE of FIG. 4) to a power line VL. This will be described later in more detail with reference to FIGS. 4 and 5.

In an embodiment, the pad area PA may be located on at least one side of the display area DA. For example, as shown in FIG. 1, the pad area PA may be located in the first direction D1 of the display area DA. However, the present disclosure is not necessarily limited thereto. For example, the pad area PA may be located in the first direction D1 and the second direction D2 of the display area DA, respectively.

Pad electrodes PE may be disposed in the pad area PA. For example, the pad electrodes PE may be arranged along the second direction D2. The pad electrodes PE may be electrically connected to an external device. That is, the pad electrodes PE may electrically connect the external device and the pixel structures PX.

The external device may be electrically connected to the display device DD through a flexible printed circuit board or a printed circuit board. For example, one side of the flexible printed circuit board may directly contact the pad electrodes PE, and the other side of the flexible printed circuit board may directly contact the external device. The external device may provide a data signal, a gate signal, an emission control signal, a gate initialization signal, an initialization voltage, a power supply voltage, or the like to the display device DD. In addition, a driving integrated circuit may be mounted on the flexible printed circuit board. In other embodiments, the driving integrated circuit may be mounted on the display device DD adjacent to the pad electrodes PE.

In FIG. 1, each of the display area DA and the pad area PA is illustrated as having a quadrangular planar shape, but the present disclosure is not necessarily limited thereto. For example, each of the display area DA and the pad area PA may have a triangular, rhombic, polygonal, circular, or elliptical planar shape.

In addition, in FIG. 1, the width of the pad area PA in the second direction D2 is illustrated as the same as the width of the display area DA in the second direction D2, but the present disclosure is not necessarily limited thereto. For example, the width of the pad area PA in the second direction D2 may be smaller than the width of the display area DA in the second direction D2.

Figure 2:
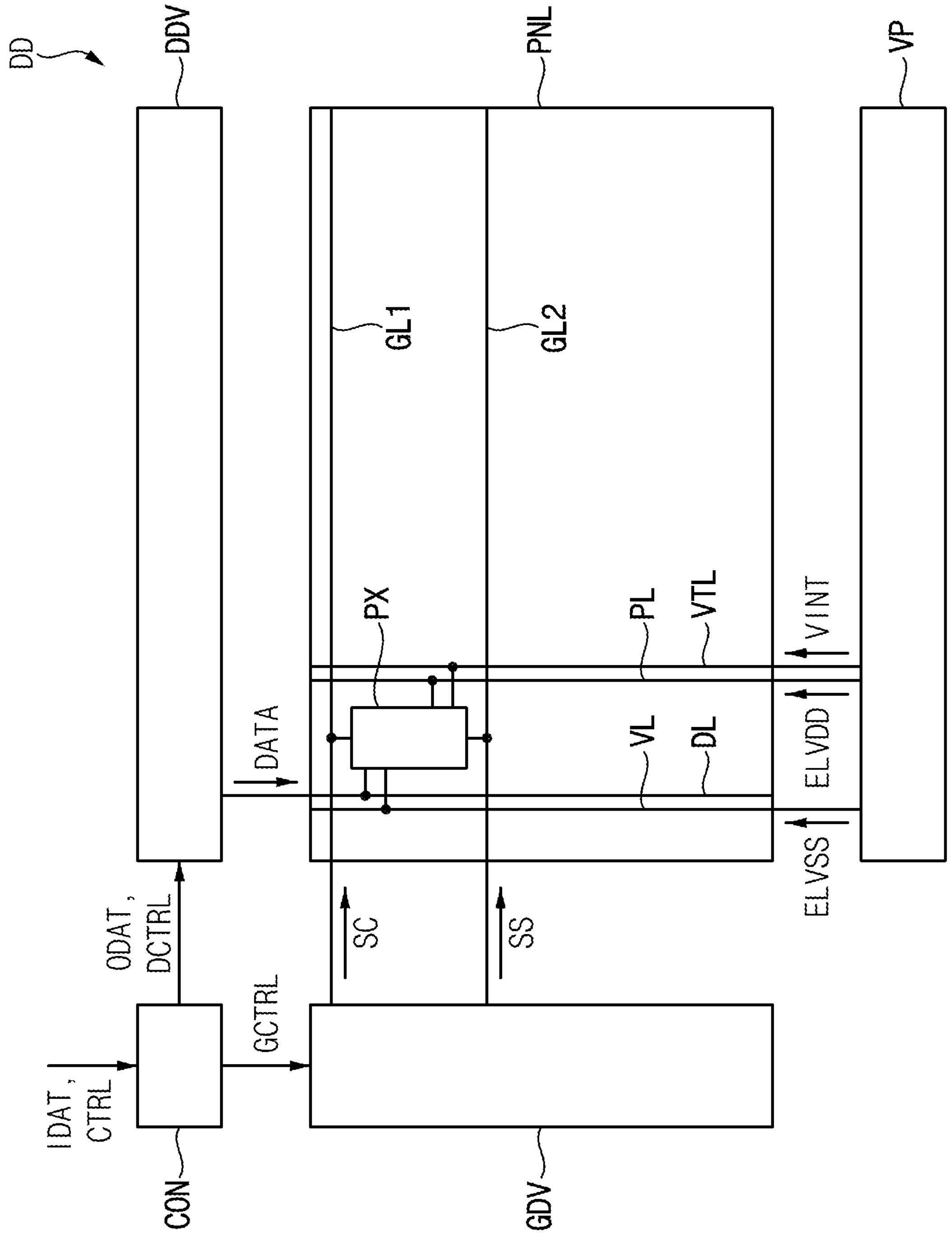
FIG. 2 is a block diagram illustrating the display device of FIG. 1.

FIG. 2 is a block diagram illustrating the display device of FIG. 1.

Referring to FIG. 2, the display device DD may include a display panel PNL, a data driver DDV, a gate driver GDV, a controller CON, and a voltage supply part VP.

The display panel PNL may include a plurality of pixel structures PX. That is, the display panel PNL may include at least one pixel structure PX.

The pixel structure PX may receive a first gate signal SC through a first gate line GL1 and receive a second gate signal SS through a second gate line GL2. In addition, the pixel structure PX may receive a data voltage DATA through a data line DL and an initialization voltage VINT through an initialization voltage line VTL. The data voltage DATA may be applied in the pixel structure PX in response to the first gate signal SC, and the initialization voltage VINT may be applied in the pixel structure PX in response to the second gate signal SS.

The data driver DDV may generate the data voltage DATA based on an output image data ODAT and a data control signal DCTRL. For example, the data driver DDV may generate the data voltage DATA corresponding to the output image data ODAT and output the data voltage DATA in response to the data control signal DCTRL. The data control signal DCTRL may include an output data enable signal, a horizontal start signal, and a load signal.

The gate driver GDV may generate first and second gate signals SC and SS based on a gate control signal GCTRL. For example, each of the first gate signal SC and the second gate signal SS may include a gate-on voltage for turning on the transistor and a gate-off voltage for turning off the transistor. The gate control signal GCTRL may include a vertical start signal and a clock signal.

The controller CON (e.g., timing controller) may receive an input image data IDAT and a control signal CTRL from an external host processor (e.g., GPU). For example, the input image data IDAT may be RGB data including red image data, green image data, and blue image data. The control signal CTRL may include a vertical sync signal, a horizontal sync signal, an input data enable signal, a master clock signal, or the like. The controller CON may generate the gate control signal GCTRL, the data control signal DCTRL, and the output image data ODAT based on the input image data IDAT and the control signal CTRL.

The voltage supply part VP may provide a driving voltage ELVDD, a common voltage ELVSS, and the initialization voltage VINT to the pixel structure PX. The driving voltage ELVDD may be provided to the pixel structure PX through the driving line PL. The common voltage ELVSS may be provided to the pixel structure PX through the power line VL and the common electrode (e.g., the common electrode CTE of FIG. 4). In other words, the power line VL may transfer the common voltage ELVSS to the common electrode CTE. The power line VL may prevent a voltage drop of the common voltage ELVSS.

Figure 3:
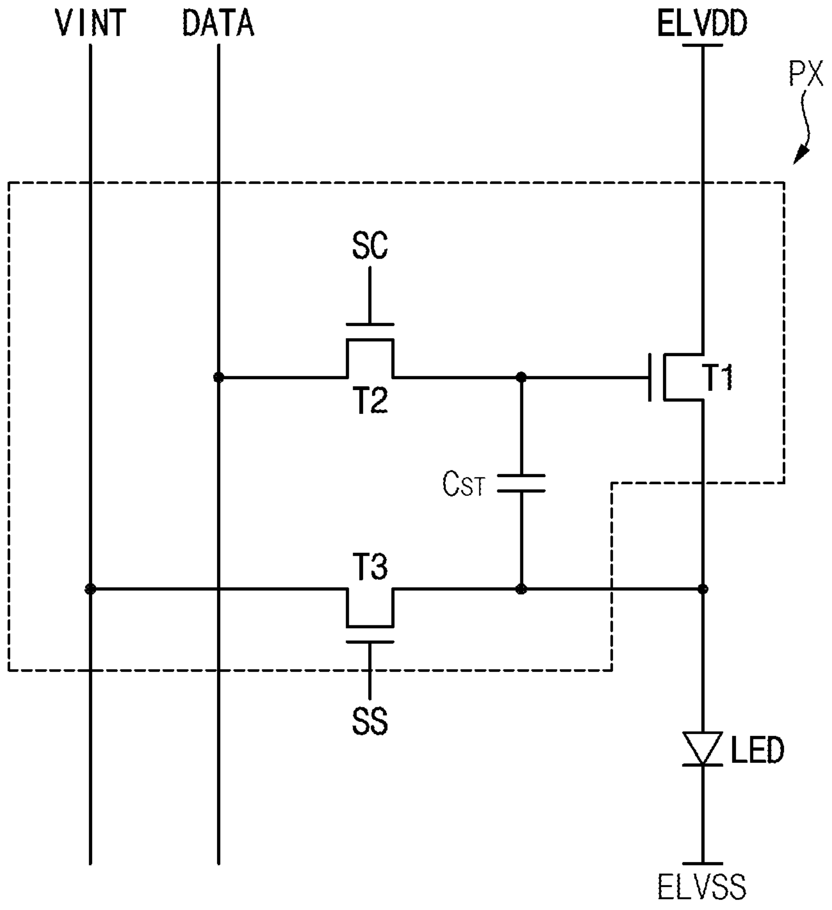
FIG. 3 is a circuit diagram illustrating a pixel structure included in the display device of FIG. 1.

FIG. 3 is a circuit diagram illustrating a pixel structure included in the display device of FIG. 1.

Referring to FIG. 3, the pixel structure PX may include a first transistor T1, a second transistor T2, a third transistor T3, and a storage capacitor CST. The pixel structure PX may be electrically connected to a light emitting device LED.

The first transistor T1 may include a first terminal, a second terminal, and a gate terminal. The first terminal may receive the driving voltage ELVDD. The second terminal may be connected to the light emitting device LED. The gate terminal may be connected to the second transistor T2. The first transistor T1 may generate a driving current based on the driving voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transmit the data voltage DATA in response to the first gate signal SC.

The third transistor T3 may include a first terminal, a second terminal, and a gate terminal. The first terminal may be connected to the first transistor T1. The second terminal may receive the initialization voltage VINT. The gate terminal may receive the second gate signal SS. The third transistor T3 may transfer the initialization voltage VINT in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain a voltage level of the gate terminal of the first transistor T1 during an inactive period of the first gate signal SC.

The light emitting device LED may include a first terminal and a second terminal. The first terminal may be connected to the second terminal of the first transistor T1. The second terminal may receive the common voltage ELVSS. The light emitting device LED may emit light having luminance corresponding to the driving current. The light emitting device LED may include an organic light emitting device using an organic material as an emission layer, an inorganic light emitting device using an inorganic material as an emission layer, or the like.

Meanwhile, a connection structure of the pixel structure PX illustrated in FIG. 3 is only an example, and may be variously changed.

Figure 4:
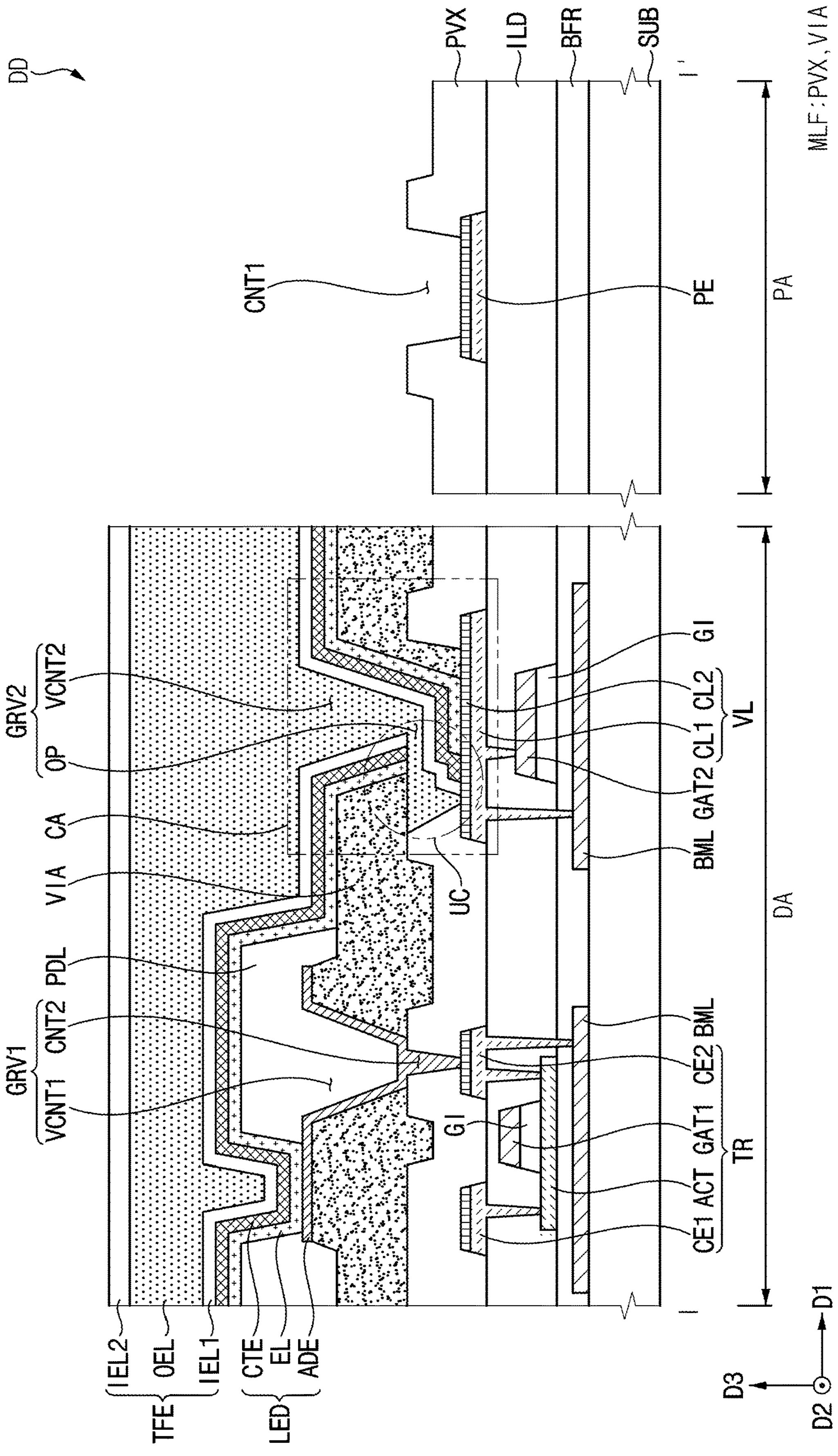
FIG. 4 is a cross-sectional view illustrating the display device of FIG. 1.
Figure 5:
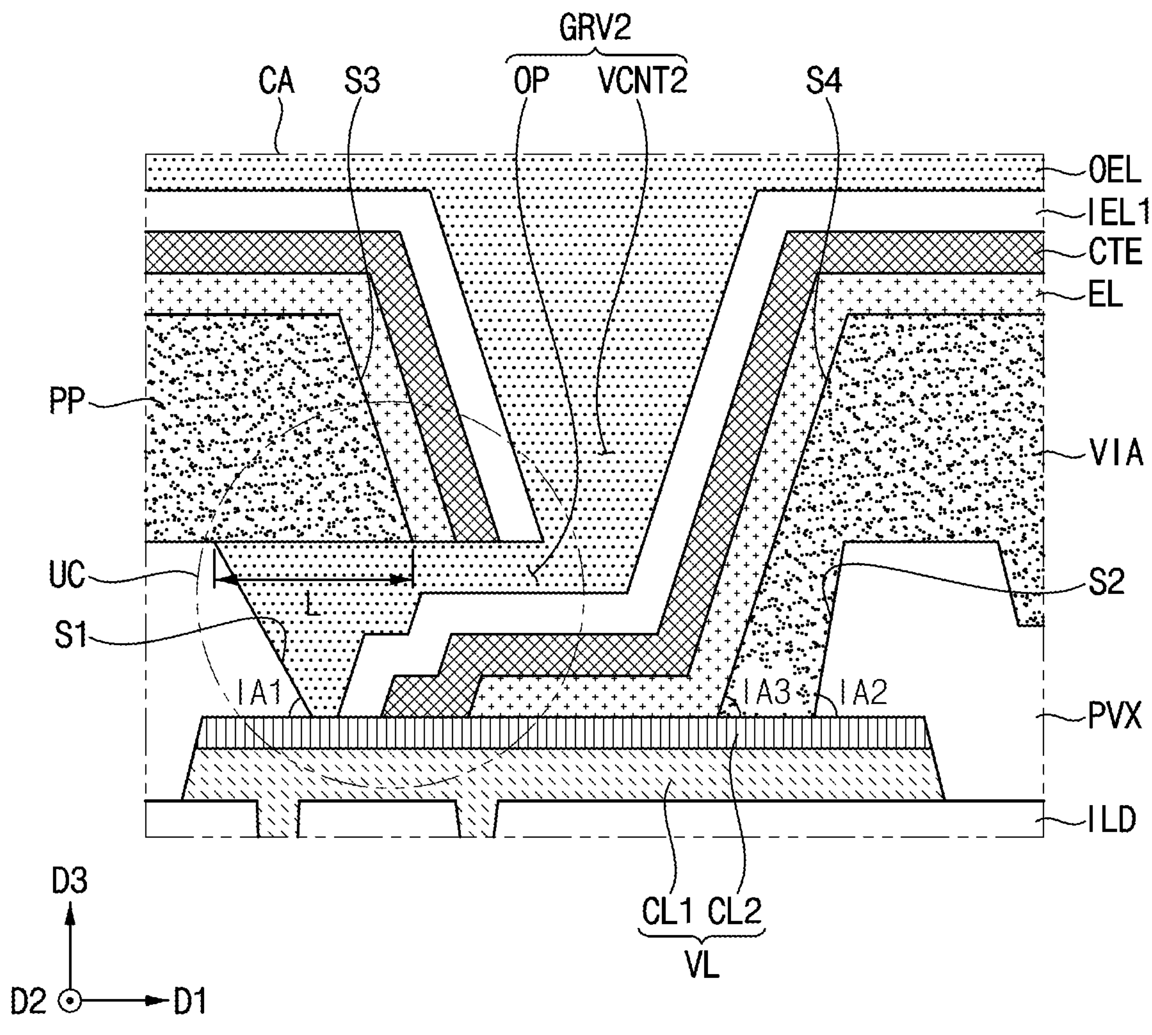
FIG. 5 is an enlarged view illustrating the contact area of FIG. 4.

FIG. 4 is a cross-sectional view illustrating the display device of FIG. 1. FIG. 5 an enlarged view illustrating the contact area of FIG. 4. For example, FIG. 4 may be a cross-sectional view taken along line I-I' of FIG. 1.

Referring to FIGS. 1 and 4, the display device DD according to an embodiment may include a substrate SUB, a back metal layer BML, a buffer layer BFR, a gate insulation layer GI, an interlayer insulation layer ILD, a transistor TR, a power line VL, a pad electrode PE, a passivation layer PVX, a via insulation layer VIA, a pixel defining layer PDL, a light emitting device LED, and an encapsulation layer TFE. The transistor TR may include an active pattern ACT, a first gate electrode GAT1, a first connection electrode CE1 and a second connection electrode CE2, and the light emitting device LED may include a pixel electrode ADE, an emission layer EL, and a common electrode CTE. The encapsulation layer TFE may include a first inorganic encapsulation layer IEL1, an organic encapsulation layer OEL, and a second inorganic encapsulation layer IEL2.

The substrate SUB may include a transparent or opaque material. In an embodiment, examples of materials that can be used as the substrate SUB may include glass, quartz, plastic, or the like. These may be used alone or in combination with each other.

The back metal layer BML may be disposed on the substrate SUB. In an embodiment, the back metal layer BML may be formed of a metal, an alloy, a conductive metal oxide, a transparent conductive material, or the like.

The buffer layer BFR may be disposed on the substrate SUB to cover the back metal layer BML. In an embodiment, the buffer layer BFR may be entirely disposed on the display area DA and the pad area PA on the substrate SUB. The buffer layer BFR may prevent diffusion of impurities such as oxygen, moisture, or the like to an upper portion of the substrate SUB through the substrate SUB. The buffer layer BFR may include an inorganic insulating material such as a silicon compound or a metal oxide. The buffer layer BFR may have a single-layer structure or a multi-layer structure including a plurality of insulating layers.

The active pattern ACT may be disposed in the display area DA on the buffer layer BFR. In an embodiment, the active pattern ACT may be formed of a silicon semiconductor material or an oxide semiconductor material. Examples of the silicon semiconductor material that can be used as the active pattern ACT may include amorphous silicon and polycrystalline silicon.

The gate insulation layer GI may be disposed on the active pattern ACT. In an embodiment, the gate insulation layer GI may be formed of an insulating material. Examples of an insulating material that can be used as the gate insulation layer GI may include silicon oxide, silicon nitride, or silicon oxynitride. These may be used alone or in combination with each other. In an embodiment, as shown in FIG. 3, the gate insulation layer GI may be disposed on the buffer layer BFR and the active pattern ACT in the form of a pattern. However, the present disclosure is not necessarily limited thereto, and in another embodiment, the gate insulation layer GI may be entirely formed on the buffer layer BFR to cover the active pattern ACT.

The first gate electrode GAT1 and the second gate electrode GAT2 may be disposed in the display area DA on the gate insulation layer GI. In an embodiment, the first gate electrode GAT1 and the second gate electrode GAT2 may be formed together by the same process. In other words, the first gate electrode GAT1 and the second gate electrode GAT2 may be disposed on the same layer. In other words, the first gate electrode GAT1 and the second gate electrode GAT2 may include the same material. For example, each of the first gate electrode GAT1 and the second gate electrode GAT2 may include a metal, an alloy, a conductive metal oxide, a transparent conductive material, or the like.

The interlayer insulation layer ILD may be disposed on the buffer layer BFR, the gate insulation layer GI, the first gate electrode GAT1 and the second gate electrode GAT2. The interlayer insulation layer ILD may cover the first gate electrode GAT1 and the second gate electrode GAT2. In an embodiment, the interlayer insulation layer ILD may be entirely disposed in the display area DA and the pad area PA on the substrate SUB. In an embodiment, the interlayer insulation layer ILD may be formed of an inorganic insulating material. Examples of inorganic insulating materials that can be used as the interlayer insulation layer ILD may include silicon oxide, silicon nitride, or silicon oxynitride. These may be used alone or in combination with each other.

The first connection electrode CE1 and the second connection electrode CE2 may be disposed in the display area DA on the interlayer insulation layer ILD. Each of the first connection electrode CE1 and the second connection electrode CE2 may penetrate the interlayer insulation layer ILD and contact the active pattern ACT. Also, the second connection electrode CE2 may penetrate the interlayer insulation layer ILD and the buffer layer BFR to contact the back metal layer BML. In an embodiment, each of the first connection electrode CE1 and the second connection electrode CE2 may include a plurality of conductive layers.

The active pattern ACT, the first gate electrode GAT1, the first connection electrode CE1, and the second connection electrode CE2 may form a transistor TR. In other words, the transistor TR may be disposed in the display area DA on the substrate SUB. For example, the transistor TR may correspond to at least one of the first to third transistors T1, T2, and T3 described with reference to FIG. 3.

The pad electrode PE may be disposed in the pad area PA on the interlayer insulation layer ILD. That is, the pad electrode PE may be disposed in the pad area PA on the substrate SUB. In an embodiment, the pad electrode PE may be formed together with the first connection electrode CE1 and the second connection electrode CE2 by the same process. In other words, the pad electrode PE may be disposed on the same layer as the first connection electrode CE1 and the second connection electrode CE2. In other words, the pad electrode PE may include the same material as the first connection electrode CE1 and the second connection electrode CE2. In an embodiment, each of the first connection electrode CE1 and the second connection electrode CE2 may include a plurality of conductive layers.

The power line VL may be disposed in the display area DA on the interlayer insulation layer ILD. In an embodiment, the power line VL may be disposed in the contact area CA in the display area DA. As described above, in the present specification, the contact area CA may be defined as an area where a portion of the passivation layer PVX and/or a portion of the via insulation layer VIA disposed on the powerline VL is patterned to electrically connect the common electrode CTE to the power line VL.

The power line VL may contact the second gate electrode GAT2 by a through hole penetrating the interlayer insulation layer ILD. In addition, the power line VL may contact the back metal layer BML by another throughhole penetrating the interlayer insulation layer ILD and the buffer layer BFR.

In an embodiment, the power line VL may be formed together with the first connection electrode CE1 and the second connection electrode CE2 by the same process. In other words, the power line VL may be disposed on the same layer as the first connection electrode CE1 and the second connection electrode CE2. In other words, the power line VL may include the same material as the first connection electrode CE1 and the second connection electrode CE2.

In an embodiment, the power line VL may include a first conductive layer CL1 and a second conductive layer CL2 disposed on the first conductive layer CL1.

In an embodiment, the first conductive layer CL1 and the second conductive layer CL2 may include different materials. For example, the first conductive layer CL1 may include a metal material, and the second conductive layer CL2 may include a metal material different from the metal material included in the first conductive layer CL1 and/or a transparent conductive oxide.

Examples of the metal material that can be used as the first conductive layer CL1 may include copper (Cu), aluminum (Al), or the like. Specifically, the first conductive layer CL1 may include copper (Cu). Examples of the metal material that can be used as the second conductive layer CL2 may include titanium (Ti), molybdenum (Mo), or the like. Examples of the transparent conductive oxide that can be used as the second conductive layer CL2 may include indium tin oxide (ITO), indium zinc oxide (IZO), zinc oxide (ZnO), indium oxide ($In_2O_3$), indium gallium oxide (IGO), aluminum zinc oxide (AZO), or the like. Specifically, the second conductive layer CL2 may include indium tin oxide (ITO).

Meanwhile, although the power line VL is illustrated as having a two-layer structure in FIG. 4, the present disclosure is not necessarily limited thereto, and in another embodiment, the power line VL may have a multi-layer structure of three or more layers.

The passivation layer PVX may be disposed on the interlayer insulation layer ILD, the first connection electrode CE1, the second connection electrode CE2, the power line VL, and the pad electrode PE. In an embodiment, the passivation layer PVX may be entirely disposed in the display area DA and the pad area PA on the interlayer insulation layer ILD.

In an embodiment, the passivation layer PVX may be formed of an inorganic insulating material. Examples of inorganic insulating material that can be used as the passivation layer PVX may include silicon oxide, silicon nitride, or silicon oxynitride. These may be used alone or in combination with each other. In addition, the passivation layer PVX may have a single-layer structure or a multi-layer structure including a plurality of insulating layers.

In an embodiment, the passivation layer PVX disposed in the pad area PA may have a first contact hole CNT1 exposing at least a portion of an upper surface of the pad electrode PE. The external device may be electrically connected to the pad electrode PE through the first contact hole CNT1. The passivation layer PVX disposed in the display area DA may have the second contact hole CNT2 exposing at least a portion of an upper surface of the second connection electrode CE2, and may further have an opening OP exposing at least a portion of an upper surface of the power line VL. For example, the opening OP may be located in the contact area CA. For example, the opening OP may expose at least a portion of the second conductive layer CL2 of the power line VL. Meanwhile, the first conductive layer CL1 of the power line VL may be entirely covered by the passivation layer PVX.

Referring further to FIG. 5 which illustrates the enlarged view of the contact area (CA) of FIG. 4, the opening OP of the passivation layer PVX may have a first side surface S1 and a second side surface S2 opposite to the first side surface S1. Each of the first side surface S1 and the second side surface S2 may contact the upper surface of the power line VL. For example, each of the first side surface S1 and the second side surface S2 may extend from the upper surface of the power line VL in the third direction D3 at a predetermined inclination angle. In the present specification, the inclination angle means a smaller angle among the angles between the upper surface of the power line VL and each of the first side surface S1 and the second side surface S2.

In an embodiment, a first inclination angle IA1 of the first side surface S1 with respect to the upper surface of the power line VL may be smaller than a second inclination angle IA2 of the second side surface S2 with respect to the upper surface of the power line VL.

In an embodiment, the first inclination angle IA1 may be about 10 degrees to about 80 degrees, and specifically, about 40 degrees to about 60 degrees. The second inclination angle IA2 may be about 10 degrees to about 80 degrees, and specifically, about 60 degrees to about 70 degrees.

Referring back to FIG. 4, the via insulation layer VIA may be disposed on the passivation layer PVX. In an embodiment, the via insulation layer VIA may be disposed in the display area DA on the passivation layer PVX. Accordingly, the passivation layer PVX and the via insulation layer VIA may form a multilayer film MLF disposed on the power line VL.

In one embodiment, the via insulation layer VIA may be formed of an organic insulating material. Examples of organic insulating material that can be used as the via insulation layer VIA may include photoresist, polyacrylic resin, polyimide resin, acrylic resin, or the like. These may be used alone or in combination with each other.

In one embodiment, the via insulation layer VIA may have a first via contact hole VCNT1 connected to the second contact hole CNT2 of the passivation layer PVX and a second via contact hole VCNT2 connected to the opening OP of the passivation layer PVX. For example, the second via contact hole VCNT2 may be located in the contact area CA. Accordingly, the multilayer film MLF including the passivation layer PVX and the via insulation layer VIA may have a first groove GRV1 and a second groove GRV2.

For example, the first groove GRV1 may be defined by connecting the second contact hole CNT2 of the passivation layer PVX and the first via contact hole VCNT1 of the via insulation layer VIA. Accordingly, the first groove GRV1 may expose at least a portion of an upper surface of the second connection electrode CE2. The pixel electrode ADE may be electrically connected to the second connection electrode CE2 through the first groove GRV1. Accordingly, the pixel electrode ADE may be electrically connected to the transistor TR.

For example, the second groove GRV2 may be defined by connecting the opening OP of the passivation layer PVX and the second via contact hole VCNT2 of the via insulation layer VIA. For example, the second groove GRV2 may be defined in the contact area CA. Accordingly, the second groove GRV2 may expose at least a portion of the upper surface of the power line VL. The emission layer EL and the common electrode CTE may be electrically connected to the power line VL in the contact area CA through the second groove GRV2.

As shown in FIG. 5, In an embodiment, the second via contact hole VCNT2 of the via insulation layer VIA may have a third side surface S3 and a fourth side surface S4 opposite to the third side surface S3.

Figure 12:
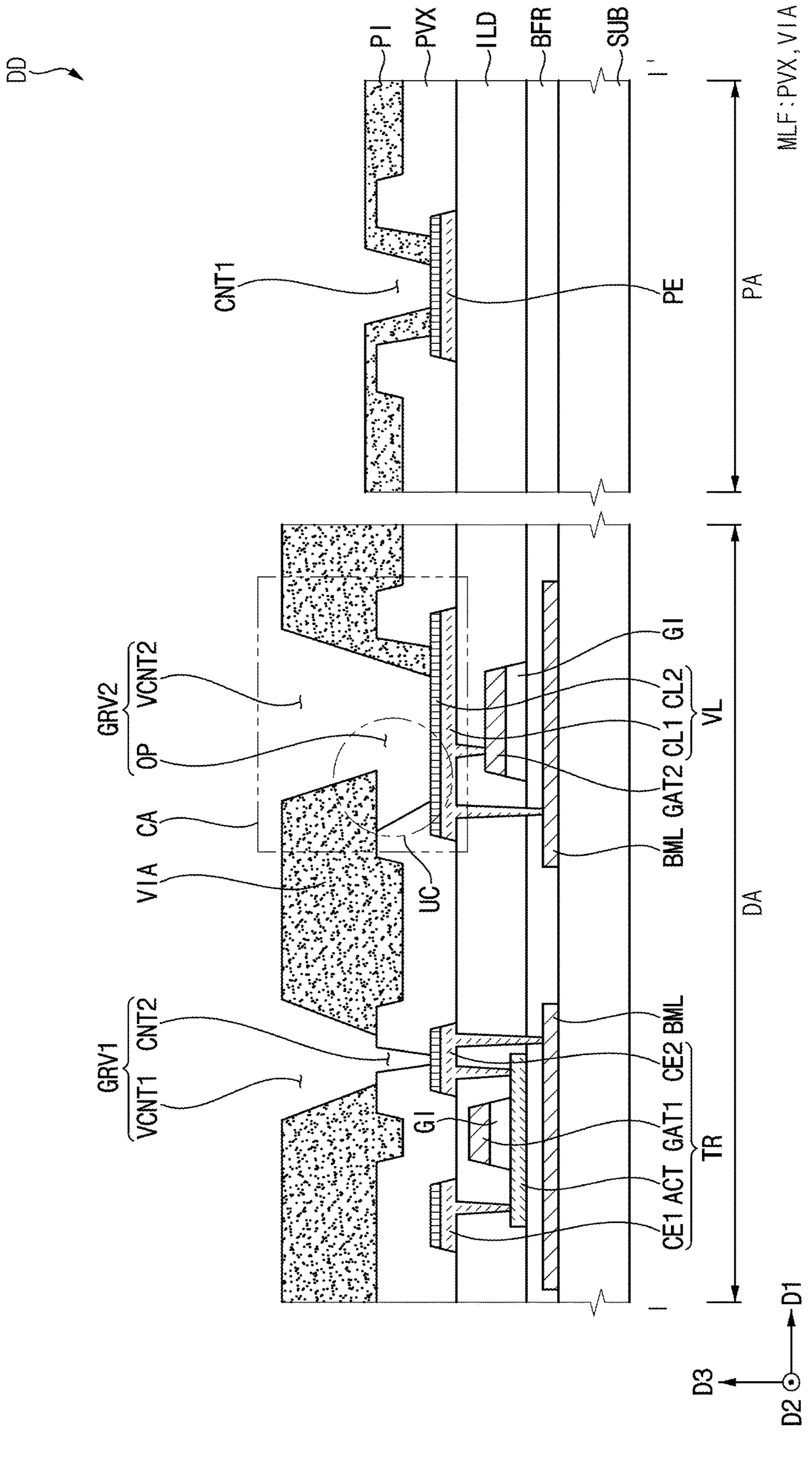
Figure 13:
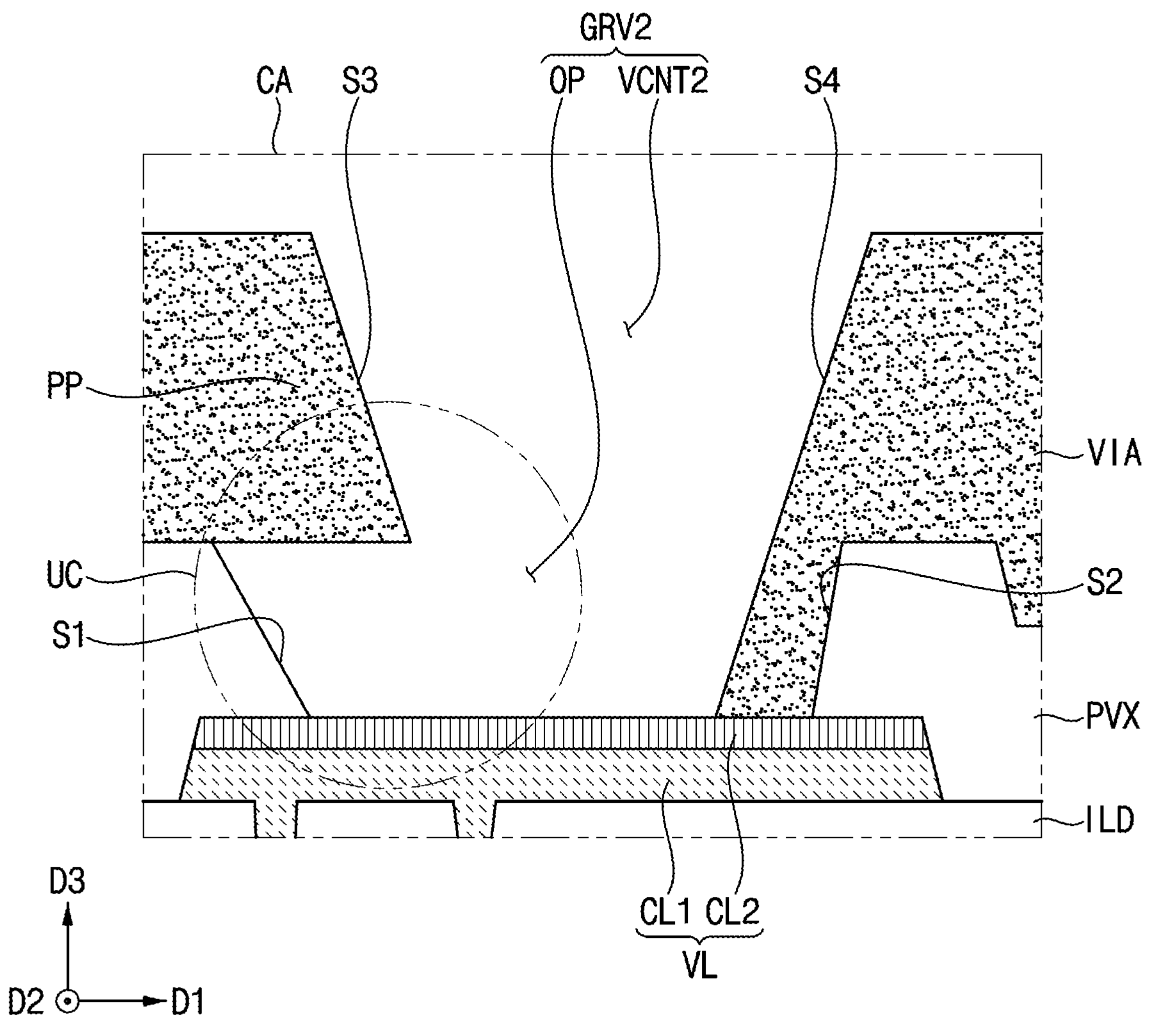

In an embodiment, the third side surface S3 of the second via contact hole VCNT2 may protrude more toward a center of the second via contact hole VCNT2 than the first side surface S1 of the opening OP. In other words, the third side surface S3 may protrude more in the first direction D1 than the first side surface S1. Furthermore, the fourth side surface S4 of the second via contact hole VCNT2 may protrude more toward a center of the second via contact hole VCNT2 than the second side surface S2. In other words, the fourth side surface S4 may protrude more in the first direction D1 than the second side surface S2. Accordingly, the via insulation layer VIA may have a protrusion PP protruding toward the center of the second via contact hole VCNT2 in the contact area CA. For example, as shown in FIGS. 12 and 13, in the manufacturing process of the display device DD, a portion of the passivation layer PVX overlapping the via insulation layer VIA and the power line VL in the contact area CA may be removed by etching process (e.g., a wet etching process using an etchant), Accordingly, a structure in which a portion of the via insulation layer VIA protrudes more than the passivation layer PVX may be formed. This will be described later in more detail with reference to FIGS. 12 and 13.

In an embodiment, the protrusion PP may form an undercut shape UC together with the first side surface S1. That is, the undercut shape UC may be defined in the contact area CA by the first side surface S1 and the protrusion PP. The undercut shape UC may overlap the power line VL.

In an embodiment, a length L of the protrusion PP protruding toward the center of the second via contact hole VCNT2 may be about 0.1 micrometers to about 5.0 micrometers, and specifically about 0.5 micrometers to about 1.5 micrometers.

In an embodiment, the fourth side surface S4 of the second via contact hole VCNT2 may contact the upper surface of the power line VL. For example, the via insulation layer VIA may be disposed such that a portion of the via insulation layer VIA extends to an inside of the opening OP to cover the second side surface S2 of the opening OP. Accordingly, the common electrode CTE may be formed along a profile of the via insulation layer VIA in the contact area CA. Meanwhile, the first side surface S1 of the opening OP may be exposed from the via insulation layer VIA. That is, the via insulation layer VIA may have an asymmetric cross-sectional shape with respect to the center of the second via contact hole VCNT2 in the contact area CA.

In an embodiment, a third inclination angle IA3 of the fourth side surface S4 with respect to the upper surface of the power line VL is smaller than the second angle IA2 of the second side surface S2 with respect to the upper surface of the power line VL. Accordingly, a disconnection of the common electrode CTE formed along the profile of the via insulation layer VIA (e.g., on the via insulation layer VIA) in the contact area CA may be prevented. In an embodiment, the third inclination angle IA3 may be about 10 degrees to about 80 degrees, and specifically, about 40 degrees to about 60 degrees. When the third inclination angle IA3 satisfies the above range, the disconnection of the common electrode CTE may be further prevented.

As shown in FIG. 4, the pixel electrode ADE may be disposed in the display area DA on the via insulation layer VIA. The pixel electrode ADE may be electrically connected to the transistor TR through the first groove GRV1 of the multilayer film MLF. For example, the pixel electrode ADE may correspond to the first terminal of the light emitting device LED described with reference to FIG. 3. In an embodiment, the pixel electrode ADE may be formed of metal, alloy, conductive metal oxide, transparent conductive material, or the like. Examples of materials that can be used as the pixel electrode ADE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The pixel defining layer PDL may be disposed in the display area DA on the via insulation layer VIA. The pixel defining layer PDL may partially cover the pixel electrode ADE on the via insulation layer VIA. The pixel defining layer PDL may have a pixel opening exposing at least a portion of an upper surface of the pixel electrode ADE. In an embodiment, the pixel defining layer PDL may be formed of an insulating material. Examples of insulating materials that can be used as the pixel defining layer PDL may include photoresist, polyacrylic resin, polyimide resin, acrylic resin, or the like. These may be used alone or in combination with each other.

The emission layer EL may be disposed in the display area DA on the via insulation layer VIA, the pixel defining layer PDL, the pixel electrode ADE, and the power line VL. In other words, the emission layer EL may be formed on the whole surface of the display area DA of the display device DD. In an embodiment, the emission layer EL may have a multilayer structure including a hole injection layer, a hole transport layer, an organic emission layer, an electron transport layer, and/or an electron injection layer. In an embodiment, a thickness of the emission layer EL may be smaller than or equal to a thickness of the passivation layer PVX.

As shown in FIG. 5, the emission layer EL may be disconnected in the contact area CA by the protrusion PP of the via insulation layer VIA. In other words, the emission layer EL may be disconnected by the undercut shape UC of the multilayer film MLF.

As shown in FIG. 4, the common electrode CTE may be disposed on the emission layer EL. In other words, the common electrode CTE may be formed on the whole surface of the display area DA of the display device DD. The common electrode CTE may correspond to the second terminal of the light emitting device LED described with reference to FIG. 3.

In an embodiment, the common electrode CTE may be formed of a metal, an alloy, a conductive metal oxide, a transparent conductive material, or the like. Examples of materials that can be used as the common electrode CTE may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other. Also, the common electrode CTE may have a single-layer structure or a multi-layer structure including a plurality of insulating layers.

As shown in FIG. 5, as the emission layer EL is disconnected in the contact area CA by the protrusion PP, the common electrode CTE may be electrically connected to the power line VL in the contact area CA. For example, the common electrode CTE may contact the power line VL in the contact area CA. For example, the common electrode CTE may contact the upper surface of the power line VL. For example, the emission layer EL may contact the second conductive layer CL2 of the power line VL. Also, in an embodiment, the common electrode CTE may cover a side surface of the emission layer EL.

In an embodiment, the common electrode CTE may be disconnected in the contact area CA by the protrusion PP of the via insulation layer VIA. In other words, the common electrode CTE may be disconnected by the undercut shape UC of the multilayer film MLF.

As shown in FIG. 4, the pixel electrode ADE, the emission layer EL, and the common electrode CTE may form the light emitting device LED. The light emitting device LED may correspond to the light emitting device LED with reference to FIG. 3.

The encapsulation layer TFE may be disposed on the common electrode CTE to cover the light emitting device LED. The encapsulation layer TFE may encapsulate the display area DA to protect the light emitting device LED from external impurities. Also, in an embodiment, the encapsulation layer TFE may fill an empty space of the second groove GRV2 of the multilayer film MLF.

In an embodiment, the encapsulation layer TFE may include at least one inorganic encapsulation layer and at least one organic encapsulation layer. For example, as shown in FIG. 4, the encapsulation layer TFE may include a first inorganic encapsulation layer IEL1, an organic encapsulation layer OEL disposed on the first inorganic encapsulation layer IEL1, and a second inorganic encapsulation layer IEL2 disposed on the organic encapsulation layer OEL. However, the present disclosure is not necessarily limited thereto.

The first inorganic encapsulation layer IEL1 may be disposed on the common electrode CTE. For example, the first inorganic encapsulation layer IEL1 may have a substantially uniform thickness along a profile of the common electrode CTE.

The organic encapsulation layer OEL may be disposed on the first inorganic encapsulation layer TELL. The organic encapsulation layer OEL may have a substantially flat upper surface without making a step around the first inorganic encapsulation layer IEL1. In an embodiment, the organic encapsulation layer OEL may be disposed to fill an empty space of the second groove GRV2 of the multilayer film MLF. For example, the organic encapsulation layer OEL may fill an empty space between the power line VL and the protrusion PP due to the undercut shape UC of the multilayer film MLF.

The second inorganic encapsulation layer IEL2 may be disposed on the organic encapsulation layer OEL. The second inorganic encapsulation layer IEL2 may have a substantially uniform thickness and a substantially flat upper surface.

FIGS. 6, 7, 8, 9, 10, 11, 12, 13, 14, 15, 16, 17, 18, and 19 are cross-sectional views illustrating a manufacturing method of the display device of FIG. 1. For example, FIG. 11 a plan view illustrating the contact area of FIG. 10, and FIG. 13 is an enlarged view of the contact area of FIG. 12.

Figure 6:
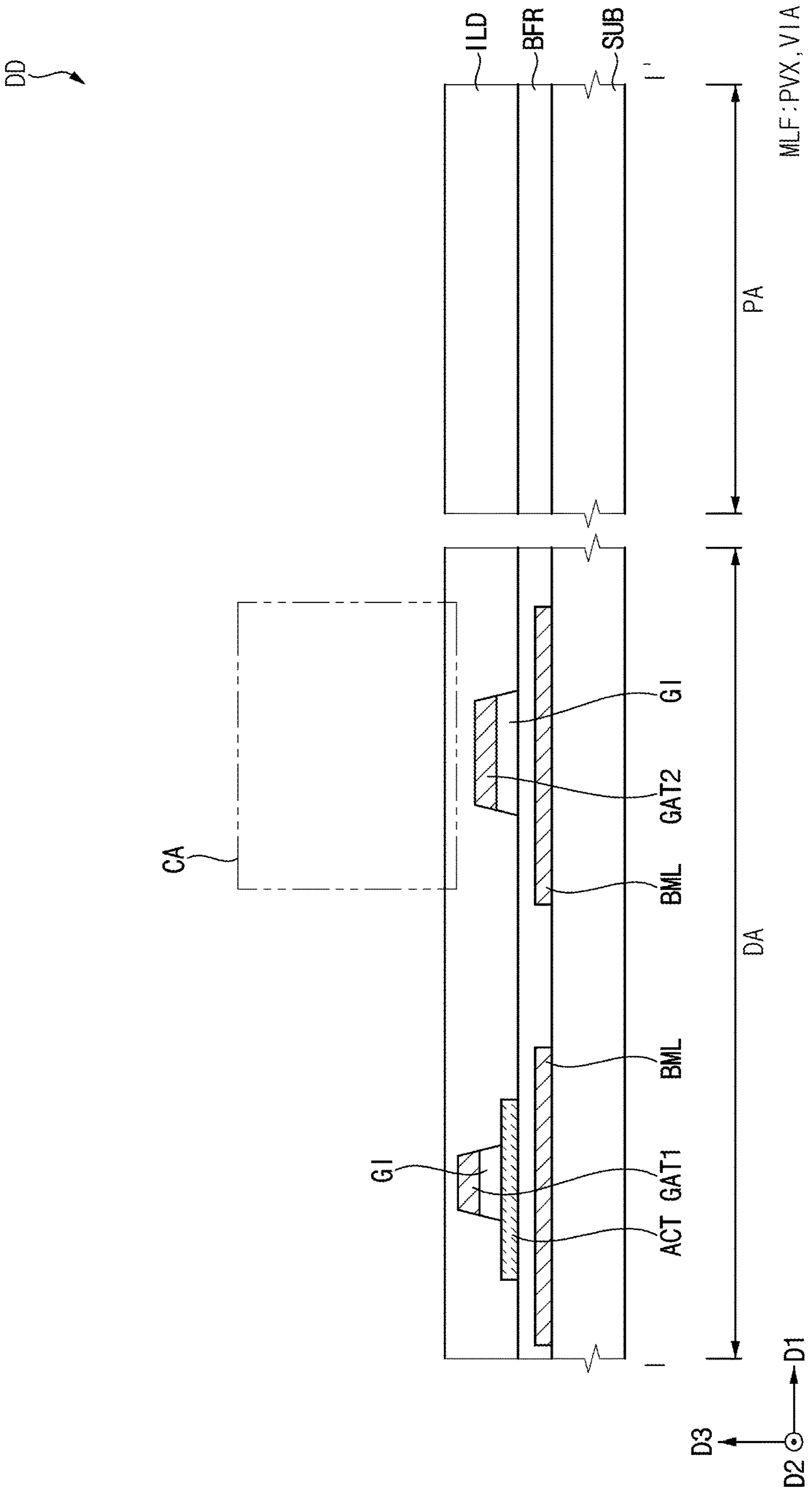
FIGS. 6, 7, 8, 9, 10, 11, 12, 13, 14, 15, 16, 17, 18, and 19 are cross-sectional views illustrating a manufacturing method of the display device of FIG. 1.

Referring to FIG. 6, the substrate SUB having a display area DA and a pad area PA may be prepared. For example, the pad area PA may be located on one side of the display area DA. The contact area CA may be located in the display area DA. In an embodiment, the substrate SUB may be a transparent insulating substrate. For example, the substrate SUB may be formed of glass, quartz, or plastic.

The back metal layer BML may be formed in the display area DA on the substrate SUB, and the buffer layer BFR may be formed on the back metal layer BML on the substrate SUB. For example, the buffer layer BFR may be entirely formed in the display area DA and the pad area PA on the substrate SUB. The buffer layer BFR formed in the display area DA may cover the back metal layer BML on the substrate SUB.

The active pattern ACT may be formed in the display area DA on the substrate SUB. For example, the active pattern ACT may be formed using amorphous silicon, polycrystalline silicon, or an oxide semiconductor.

The gate insulation layer GI may be formed on the active pattern ACT. In an embodiment, the gate insulation layer GI may be formed on the buffer layer BFR and the active pattern ACT in the form of a pattern. For example, the gate insulating layer GI may be formed using an inorganic insulating material such as silicon oxide, silicon nitride, or silicon oxynitride.

The first gate electrode GAT1 and a second gate electrode GAT2 may be formed on the gate insulation layer GI. The first gate electrode GAT1 may be formed to overlap the active pattern ACT. For example, each of the first gate electrode GAT1 and the second gate electrode GAT2 may be formed using a metal, an alloy, a conductive metal oxide, a conductive metal nitride, a transparent conductive material, or the like.

The interlayer insulation layer ILD may be formed on the buffer layer BFR, the gate insulation layer GI, the first gate electrode GAT1, and the second gate electrode GAT2. For example, the interlayer insulation layer ILD may be entirely formed in the display area DA and the pad area PA on the buffer layer BFR. An interlayer insulation layer ILD formed in the display area DA may cover the first gate electrode GAT1 and the second gate electrode GAT2. For example, the interlayer insulation layer ILD may be formed using an inorganic insulating material such as silicon oxide, silicon nitride, or silicon oxynitride.

Figure 7:
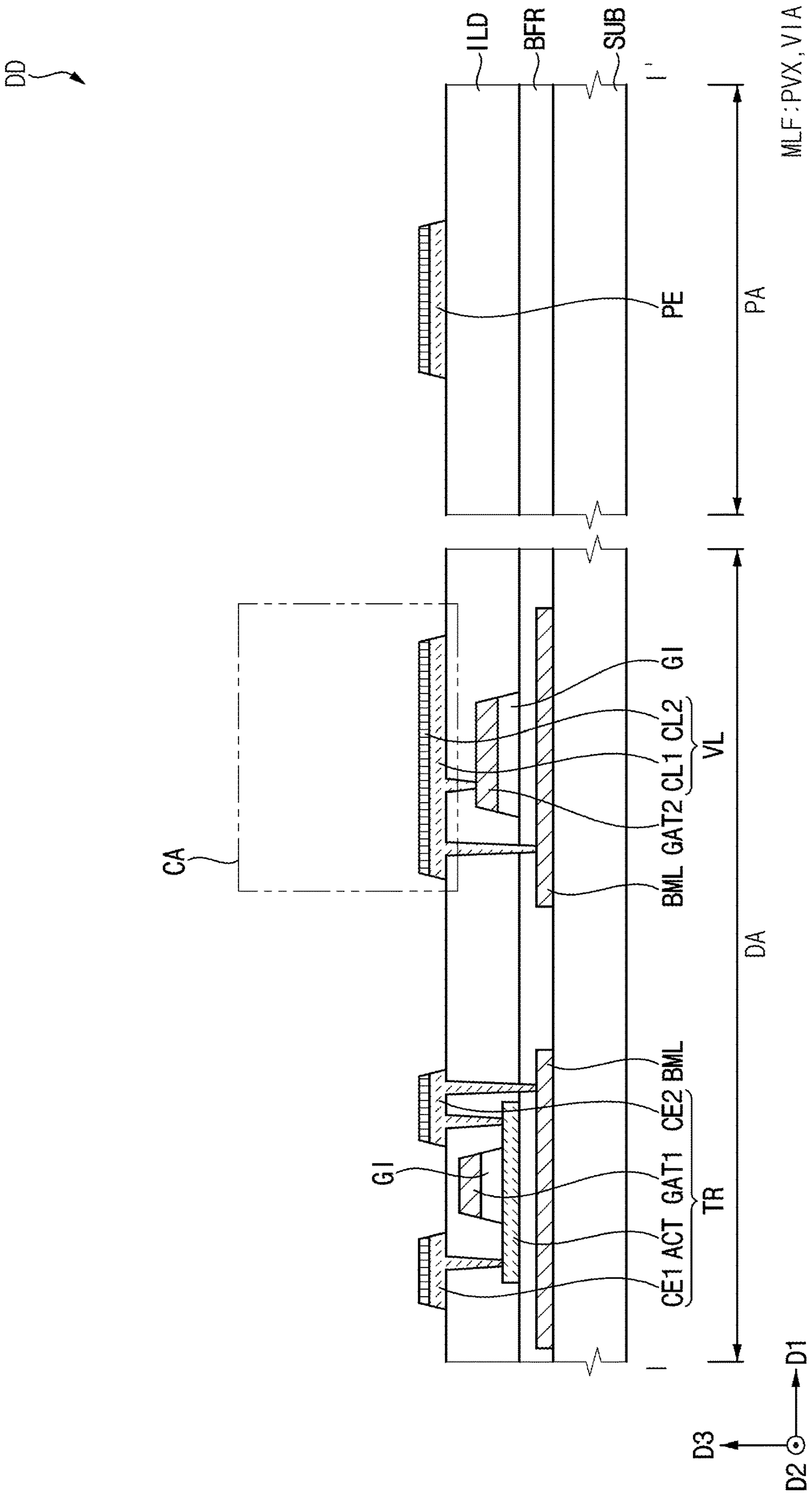

Referring to FIG. 7, the first connection electrode CE1, the second connection electrode CE2, the power line VL, and the pad electrode PE may be formed on the interlayer insulation layer ILD. For example, the pad electrode PE may be formed in the pad area PA on the interlayer insulation layer ILD, and the first connection electrode CE1, the second connection electrode CE2, and the power line VL may be formed in the display area DA on the interlayer insulation layer ILD. Specifically, the power line VL may be formed to overlap the contact area CA.

In an embodiment, the first connection electrode CE1 and the second connection electrode CE2 may be formed to contact the active pattern ACT by through holes penetrating the interlayer insulation layer ILD. Also, the second connection electrode CE2 may be formed to contact the back metal layer BML by a through hole penetrating the interlayer insulation layer ILD and the buffer layer BFR.

In one embodiment, the power line VL may be formed to contact the second gate electrode GAT2 by a through hole penetrating the interlayer insulation layer ILD. In addition, the power line VL may be formed to contact the back metal layer BML by a through hole penetrating the interlayer insulation layer ILD and the buffer layer BFR.

In an embodiment, the first connection electrode CE1, the second connection electrode CE2, the pad electrode PE, and the power line VL may be formed substantially simultaneously. For example, the first connection electrode CE1, the second connection electrode CE2, the pad electrode PE, and the power line VL may be formed by providing a metal layer on the interlayer insulation layer ILD and patterning the metal layer.

In an embodiment, the metal layer may include a first metal layer and a second metal layer disposed on the first metal layer. Accordingly, each of the first connection electrode CE1, the second connection electrode CE2, the pad electrode PE, and the power line VL may be a stacked multilayer structure which has a conductive layer formed from the first metal layer and a conductive layer formed from the second metal layer. For example, the power line VL may include a first conductive layer CL1 formed from the first metal layer and a second conductive layer CL2 formed from the second metal layer.

In an embodiment, the first conductive layer CL1 and the second conductive layer CL2 may be formed of different materials. For example, the first conductive layer CL1 may be formed of a metal material such as copper (Cu), and the second conductive layer CL2 may be formed of a transparent conductive oxide such as indium tin oxide (ITO).

Figure 8:
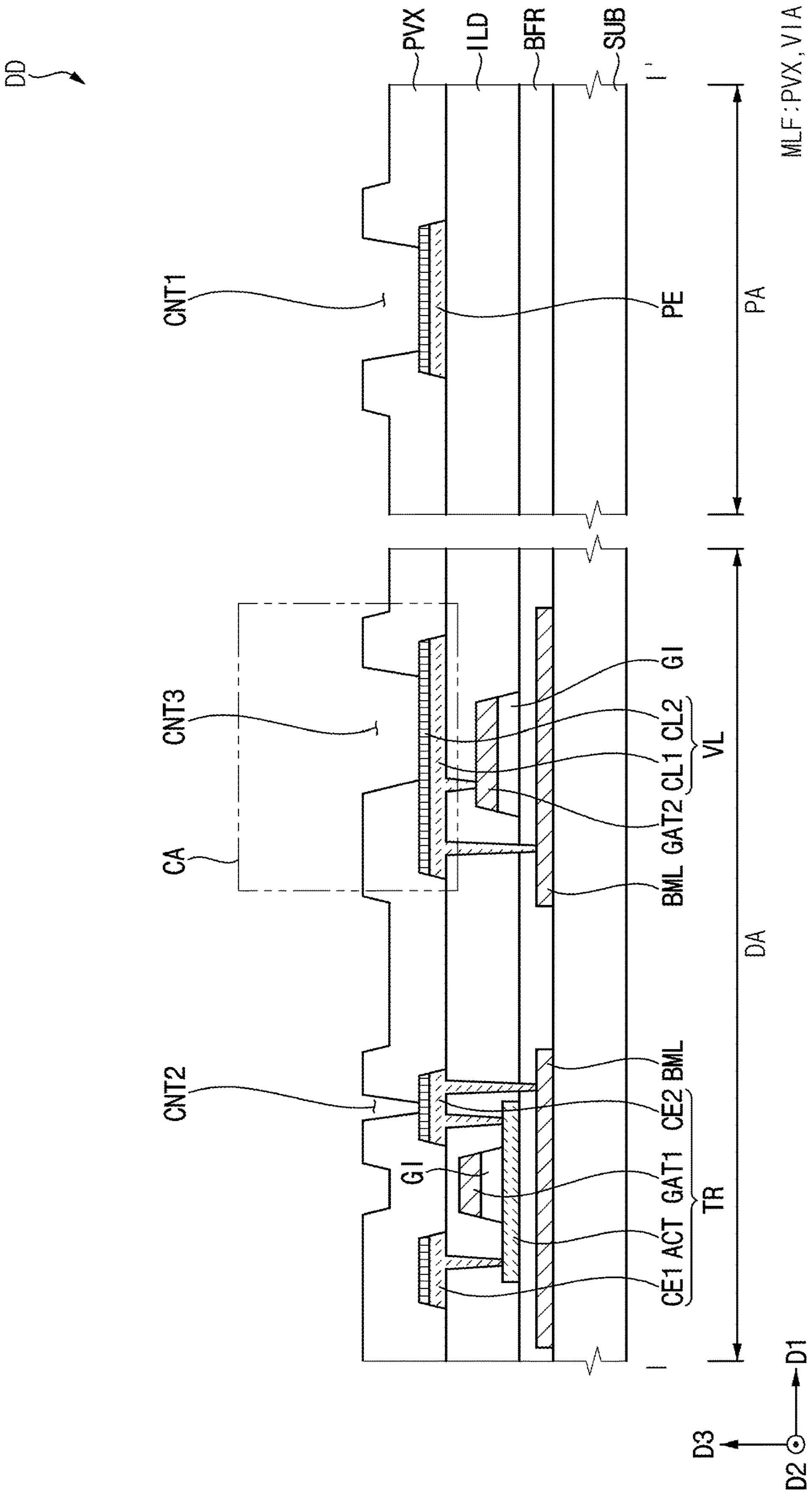

Referring to FIG. 8, the passivation layer PVX may be formed on the interlayer insulation layer ILD, the first connection electrode CE1, the second connection electrode CE2, the power line VL, and the pad electrode PE. For example, the passivation layer PVX may be entirely formed in the display area DA and the pad area PA on the interlayer insulation layer ILD.

In an embodiment, the passivation layer PVX may be formed using an inorganic insulating material such as silicon oxide, silicon nitride, or silicon oxynitride.

The first contact hole CNT1, the second contact hole CNT2, and a third contact hole CNT3 may be formed in the passivation layer PVX. The first contact hole CNT1 may expose at least a portion of the upper surface of the pad electrode PE. The second contact hole CNT2 may expose at least a portion of the upper surface of the second connection electrode CE2. The third contact hole CNT3 may expose at least a portion of the upper surface of the power line VL in the contact area CA. The first to third contact holes CNT1, CNT2, and CNT3 may be formed substantially simultaneously.

Figure 9:
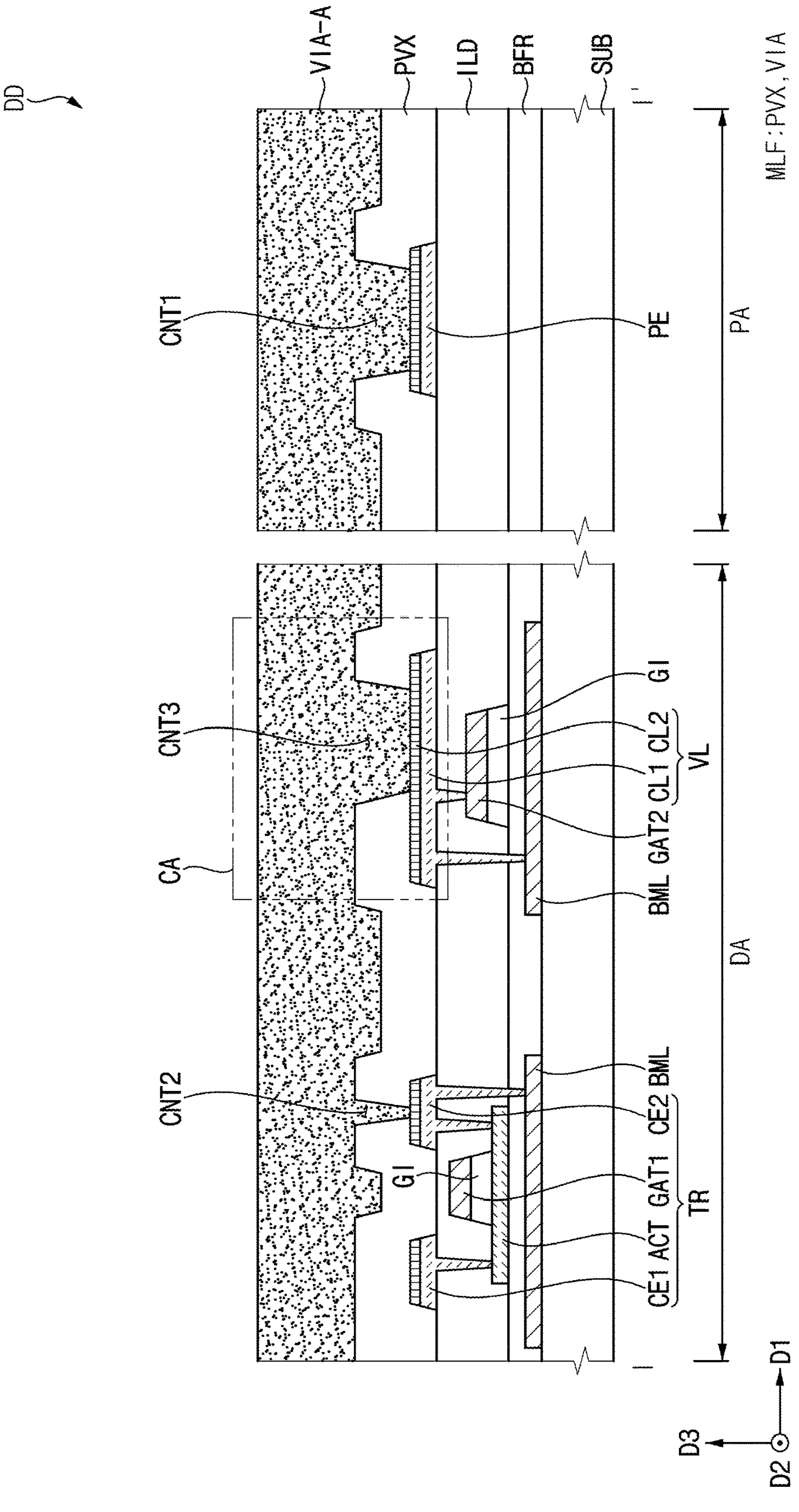
Figure 10:
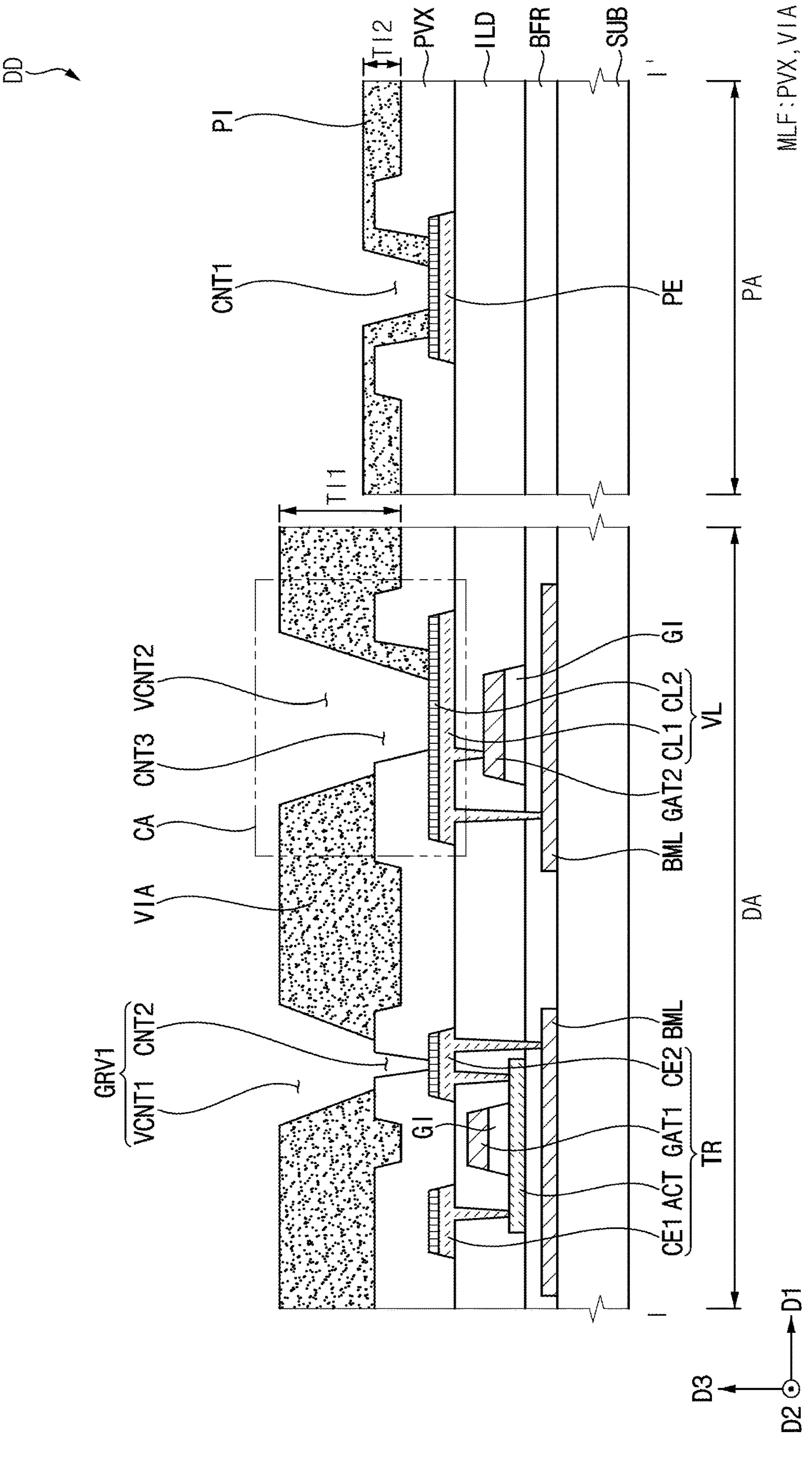

Referring to FIGS. 9 and 10, the via insulation layer VIA and a protective insulation layer PI may be formed on the passivation layer PVX and the power line VL. For example, the via insulation layer VIA may be formed in the display area DA on the passivation layer PVX, and the protective insulation layer PI may be formed in the pad area PA on the passivation layer PVX. The protective insulation layer PI may cover the passivation layer PVX in the pad area PA.

The via insulation layer VIA and the protective insulation layer PI may be formed substantially simultaneously. For example, the via insulation layer VIA and the protective insulation layer PI may be integrally formed. For example, as shown in FIG. 10, the via insulation layer VIA having a first thickness TI1 and the protective insulation layer PI having a second thickness TI2 may be formed in the same process by applying a preliminary via insulation layer VIA-A on the passivation layer PVX, the first connection electrode CE1, the second connection electrode CE2, the power line VL, and the pad electrode PE. Thereafter, the preliminary via insulation layer VIA-A is patterned by irradiating a light with different exposure amounts to areas corresponding to the via insulation layer VIA and the protective insulation layer PI using a half-tone mask, etc. In an embodiment, the second thickness TI2 of the protective insulation layer PI may be smaller than the first thickness TI1 of the via insulation layer VIA.

In an embodiment, the via insulation layer VIA and the protective insulation layer PI may be formed using an organic insulating material such as photoresist, polyacrylic resin, polyimide resin, or acrylic resin.

Also, in the process of patterning the preliminary via insulation layer VIA-A, the first via contact hole VCNT1 and the second via contact hole VCNT2 may be formed in the via insulation layer VIA. The first via contact hole VCNT1 may be connected to the second contact hole CNT2. The second via contact hole VCNT2 may be connected to the third contact hole CNT3. In this case, the second contact hole CNT2 and the first via contact hole VCNT1 may be connected to each other to form the first groove GRV1. The first groove GRV1 may expose at least a portion of the upper surface of the second connection electrode CE2. In an embodiment, the first via contact hole VCNT1 and the second via contact hole VCNT2 may be formed substantially simultaneously.

Figure 11:
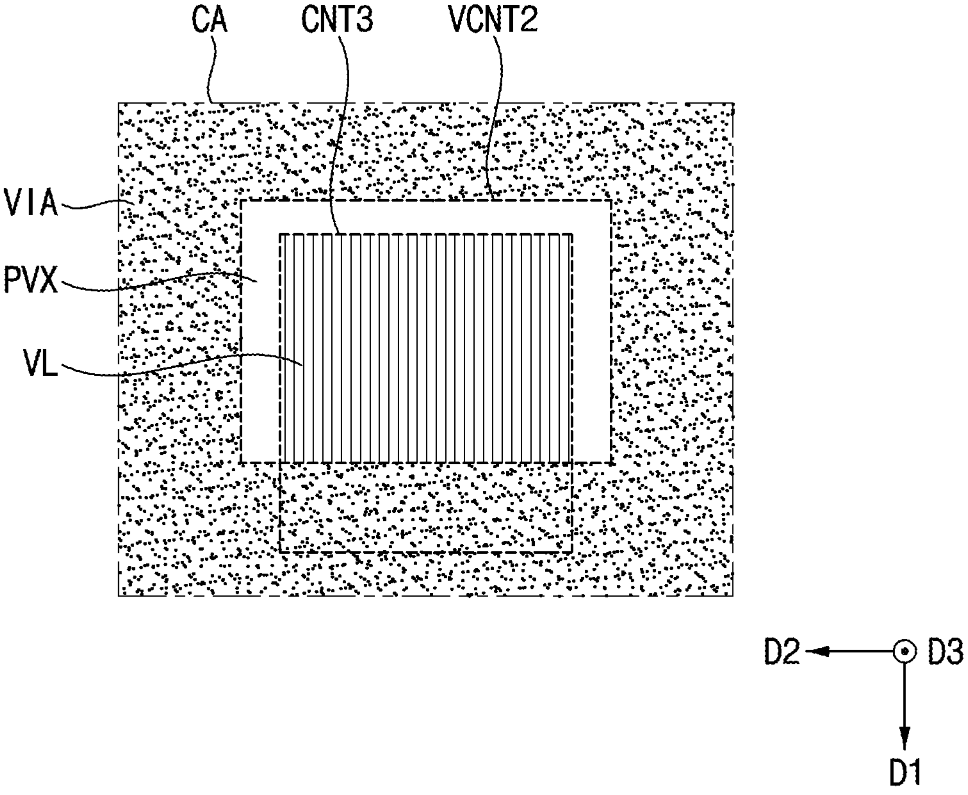

Referring further to FIG. 11, in an embodiment, the second via contact hole VCNT2 may be formed to partially overlap the third contact hole CNT3 in a plan view. That is, a portion of the second via contact hole VCNT2 may overlap the third contact hole CNT3 in a plan view, and the remaining portion of the second via contact hole VCNT2 may be spaced apart from the third contact hole CNT3 in a plan view. Accordingly, as shown in FIG. 10, the via insulation layer VIA may be formed such that a portion of the via insulation layer VIA extends to the inside of the third contact hole CNT3 in the contact area CA to cover one side surface of the third contact hole CNT3. Meanwhile, the other side of the third contact hole CNT3 may be exposed from the via insulation layer VIA. That is, the via insulation layer VIA may be formed to have an asymmetric cross-sectional shape with respect to the center of the second via contact hole VCNT2 in the contact area CA.

Meanwhile, an arrangement in a plan view of the third contact hole CNT3 and the second via contact hole VCNT2 shown in FIG. 11 is only an example, and the present disclosure is not necessarily limited thereto. For example, the arrangement of the second via contact hole VCNT2 in a plan view may be variously changed only when only a portion of the second via contact hole VCNT2 overlaps the third contact hole CNT3 in a plan view.

Referring to FIGS. 12 and 13, a portion of the passivation layer PVX overlapping the via insulation layer VIA and the power line VL in the contact area CA may be removed. For example, a portion of the passivation layer PVX overlapping the via insulation layer VIA and the power line VL in the contact area CA but exposed from the via insulation layer VIA may be removed.

In an embodiment, a portion of the passivation layer PVX may be removed through an etching process. For example, the etching process may be a wet etching process using an etchant.

As a portion of the passivation layer PVX is removed, the opening OP having the first side surface S1 and the second side surface S2 may be formed in the passivation layer PVX. For example, the opening OP may have an area larger than an area of the third contact hole CNT3.

The first side surface S1 may be formed by removing a portion of the passivation layer PVX through an etching process, and the second side surface S2 may be substantially the same as the one side of the third contact hole CNT3 covered by the via insulation layer VIA. Accordingly, the first side surface S1 formed through the etching process and the second side surface S2 not affected by the etching process may have different inclination angles with respect to the upper surface of the power line VL. For example, the first inclination angle IA1 of the first side surface S1 with respect to the upper surface of the power line VL may be smaller than the second inclination angle IA2 of the second side surface S2 with respect to the upper surface of the power line VL.

In addition, as a portion of the passivation layer PVX is removed, the third side surface S3 of the second via contact hole VCNT2 may further protrude than the first side surface S1 of the opening OP toward the center of the via contact hole VCNT2 in the contact area CA. Accordingly, the via insulation layer VIA may have the protrusion PP protruding toward the center of the second via contact hole VCNT2 in the contact area CA.

Accordingly, the undercut shape UC by the first side surface S1 and the protrusion PP may be defined in the contact area CA. That is, the multilayer film MLF including the passivation layer PVX and the via insulation layer VIA may have the undercut shape UC in the contact area CA.

Meanwhile, the opening OP may be connected to the second via contact hole VCNT2 to form the second groove GRV2. The second groove GRV2 may be defined in the contact area CA. Accordingly, the second groove GRV2 may expose at least a portion of the upper surface of the power line VL.

Figure 14:
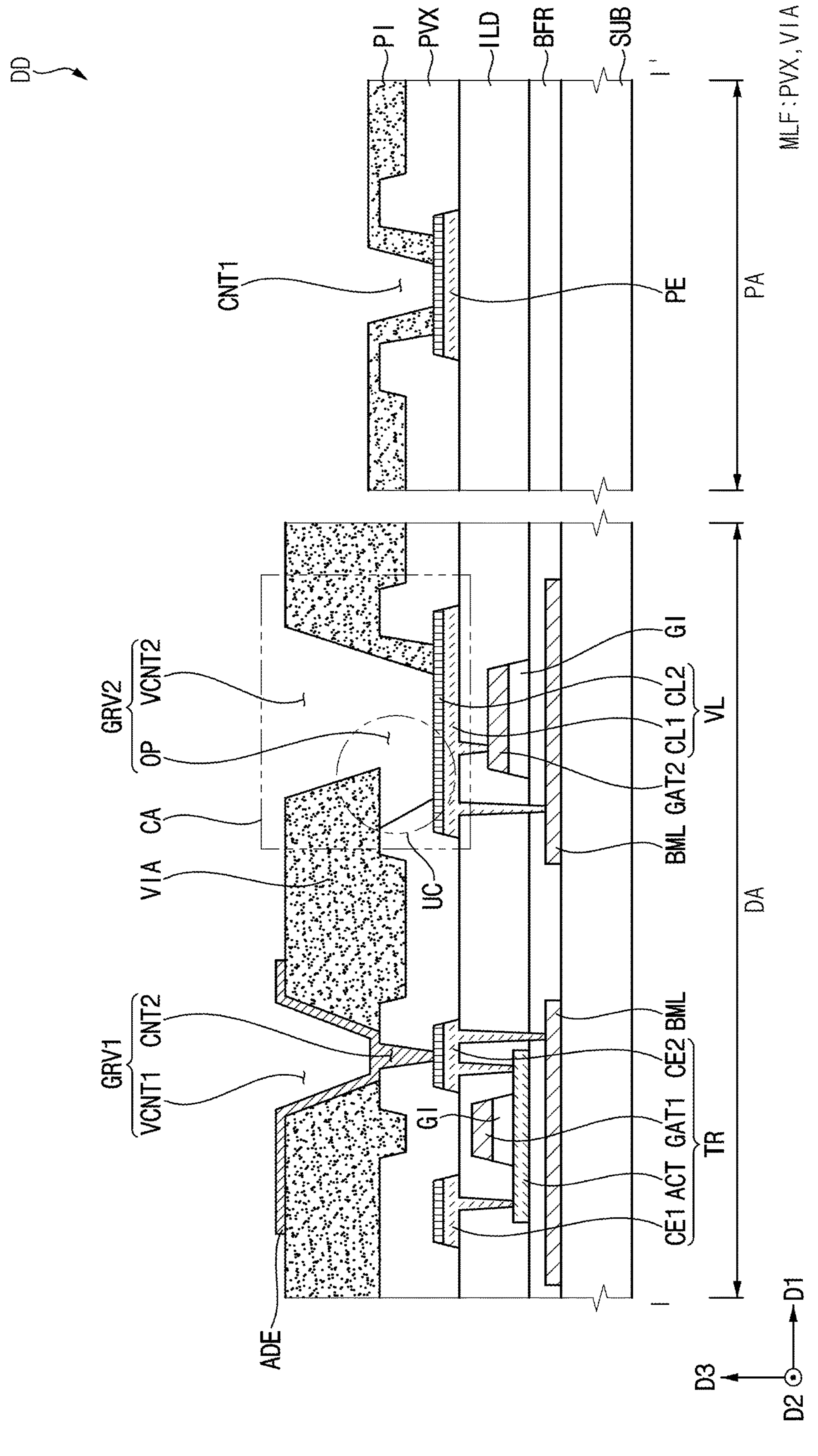

Referring to FIG. 14, the pixel electrode ADE may be formed in the display area DA on the via insulation layer VIA. The pixel electrode ADE may be electrically connected to the second connection electrode CE2 through the first groove GRV1. The pixel electrode ADE may be formed using a metal, an alloy, a conductive metal oxide, a conductive metal nitride, a transparent conductive material, or the like.

Figure 15:
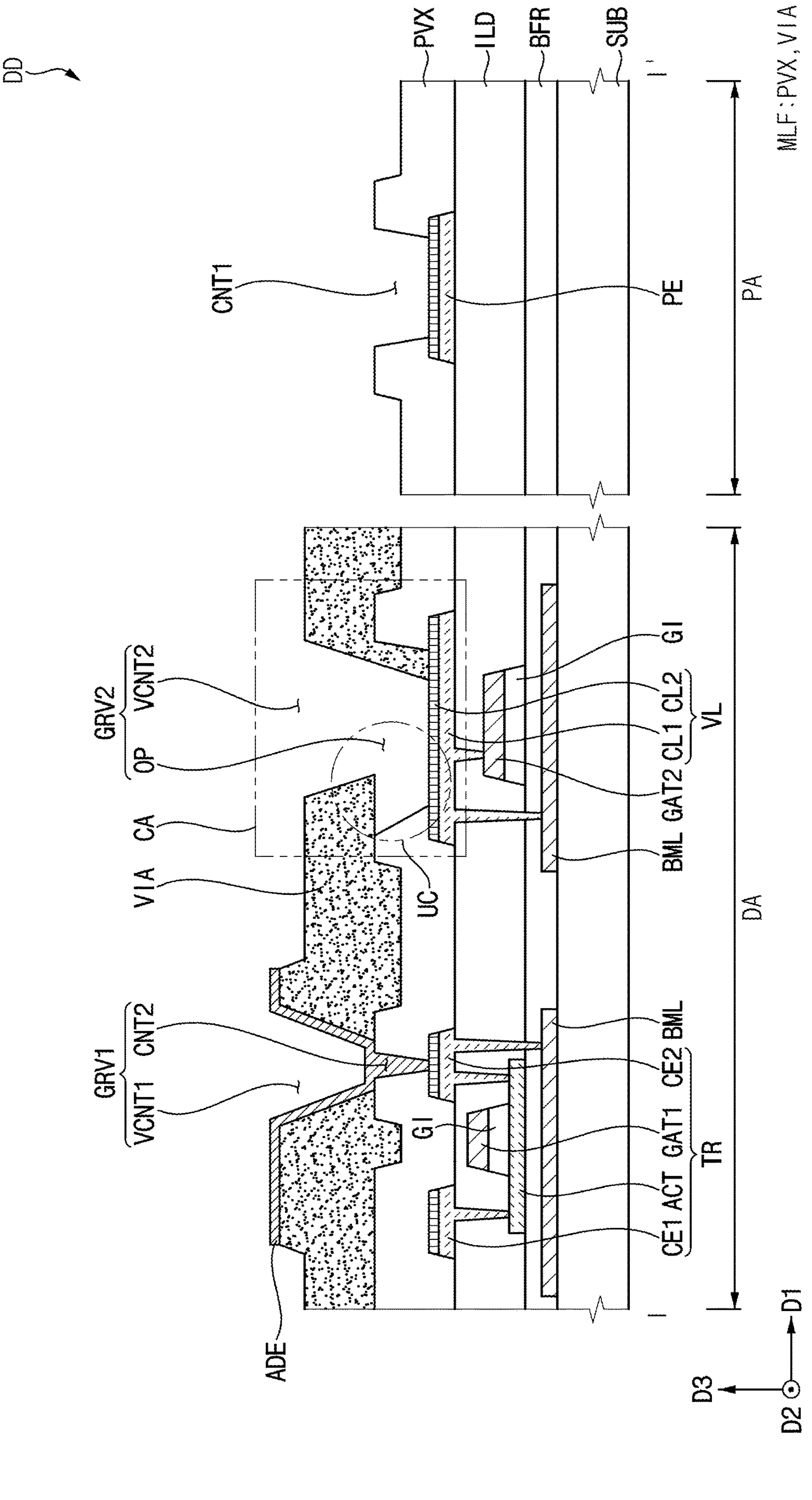

Referring to FIG. 15, the protective insulation layer PI may be removed from the pad area PA. For example, the protective insulation layer PI may be removed through an ashing process.

Meanwhile, in the process of ashing the protective insulation layer PI, a portion of the via insulation layer VIA may be ashed together. For example, in the process of ashing the protective insulation layer PI, a portion of the via insulation layer VIA of the display area DA exposed from the pixel electrode ADE may be affected by the ashing process. Accordingly, a portion of the via insulation layer VIA exposed from the pixel electrode ADE may be reduced by the second thickness TI2 of the protective insulation layer PI. Therefore, as shown in FIG. 15, after the protective insulation layer PI is removed, the upper surface of the via insulation layer VIA in the display area DA may have a step.

Meanwhile, although the protective insulation layer PI is removed after the pixel electrode ADE is formed on the via insulation layer VIA in FIGS. 14 and 15, the present disclosure is not necessarily limited thereto. In another embodiment, first, the protective insulation layer PI may be removed before forming the pixel electrode ADE. In this case, the overall thickness of the via insulation layer VIA may be reduced by the second thickness TI2 of the protective insulation layer PI. Therefore, even after the protective insulation layer PI is removed, the upper surface of the via insulation layer VIA in the display area DA may have a substantially flat upper surface. In other words, even after the protective insulation layer PI is removed, the upper surface of the via insulation layer VIA in the display area DA may not have a step.

Figure 16:
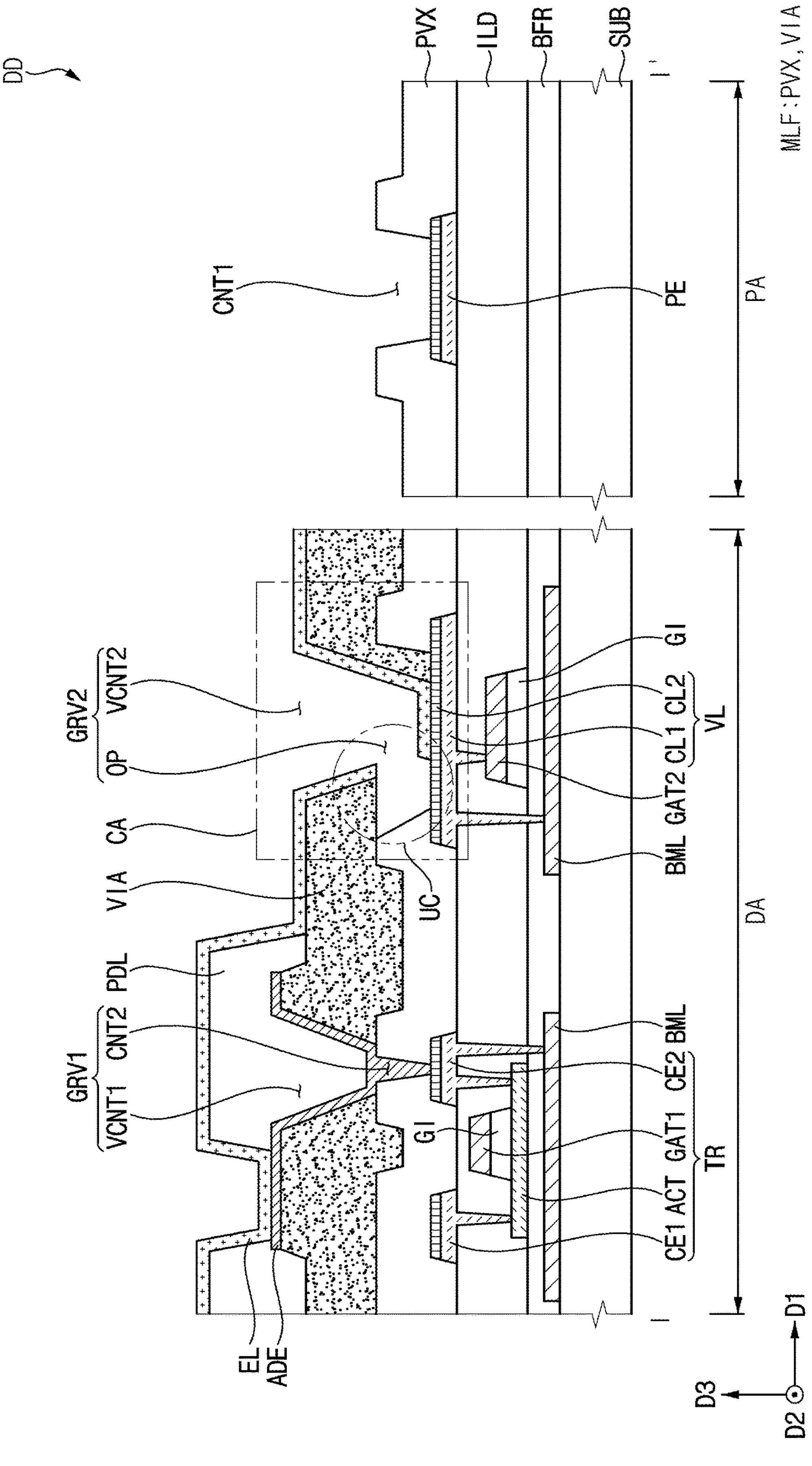

Referring to FIG. 16, the pixel defining layer PDL may be formed in the display area DA on the via insulation layer VIA. The pixel defining layer PDL may partially cover the pixel electrode ADE on the via insulation layer VIA. The pixel defining layer PDL may have the pixel opening exposing at least a portion of the upper surface of the pixel electrode ADE. For example, the pixel defining layer PDL may be formed using an insulating material such as photoresist, polyacrylic resin, polyimide resin, or acrylic resin.

Thereafter, the emission layer EL may be formed in the display area DA on the via insulation layer VIA, the pixel defining layer PDL, the pixel electrode ADE, and the power line VL. In other words, the emission layer EL may be formed on the whole surface of the display area DA of the display device DD.

Figure 17:
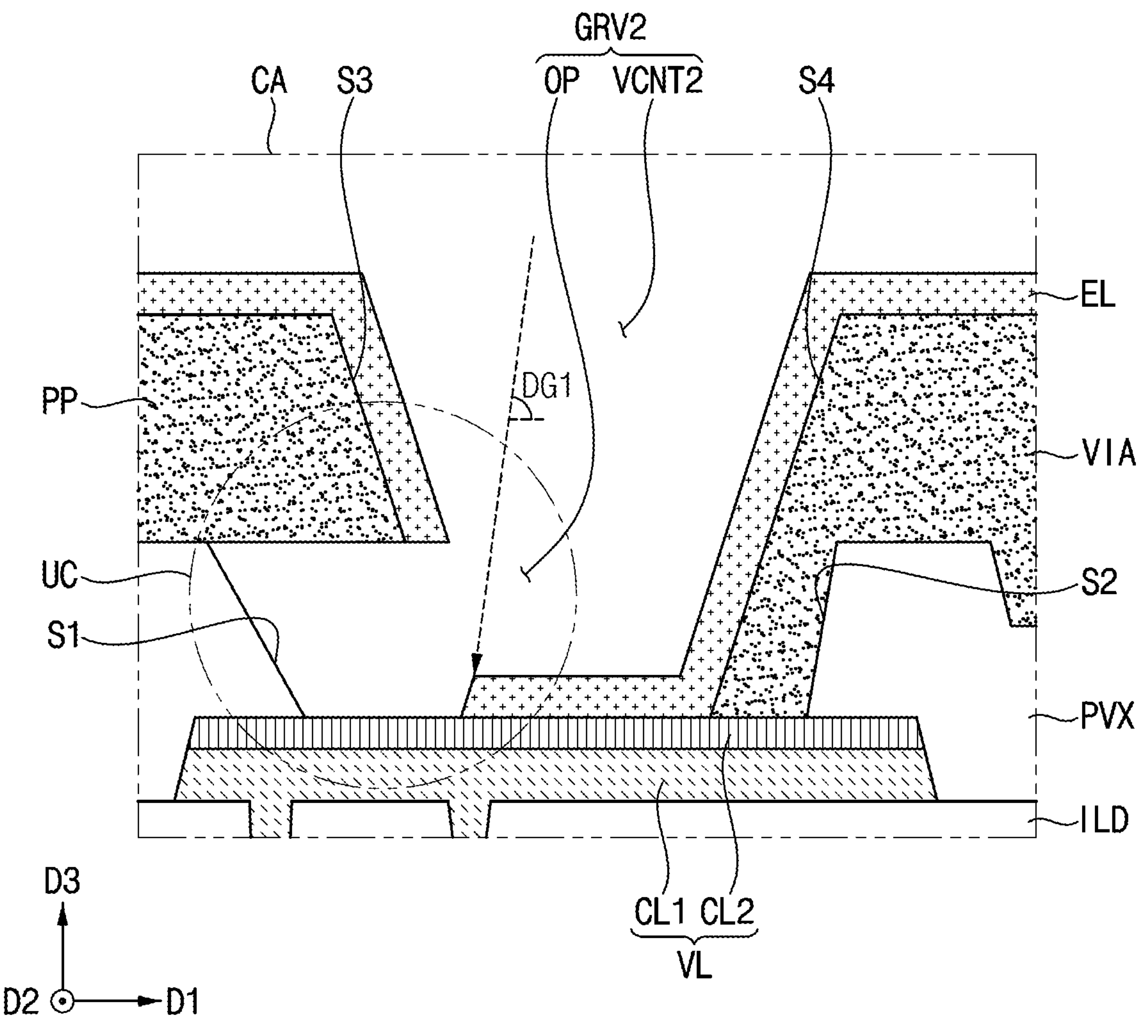

Referring further to FIG. 17, the emission layer EL may be formed on the power line VL in the contact area CA. In an embodiment, the emission layer EL may be deposited at a first angle DG1 with respect to the common electrode CTE. The emission layer EL may be disconnected in the contact area CA by the protrusion PP of the via insulation layer VIA. In other words, the emission layer EL may be disconnected by the undercut shape UC of the multilayer film MLF.

Figure 18:
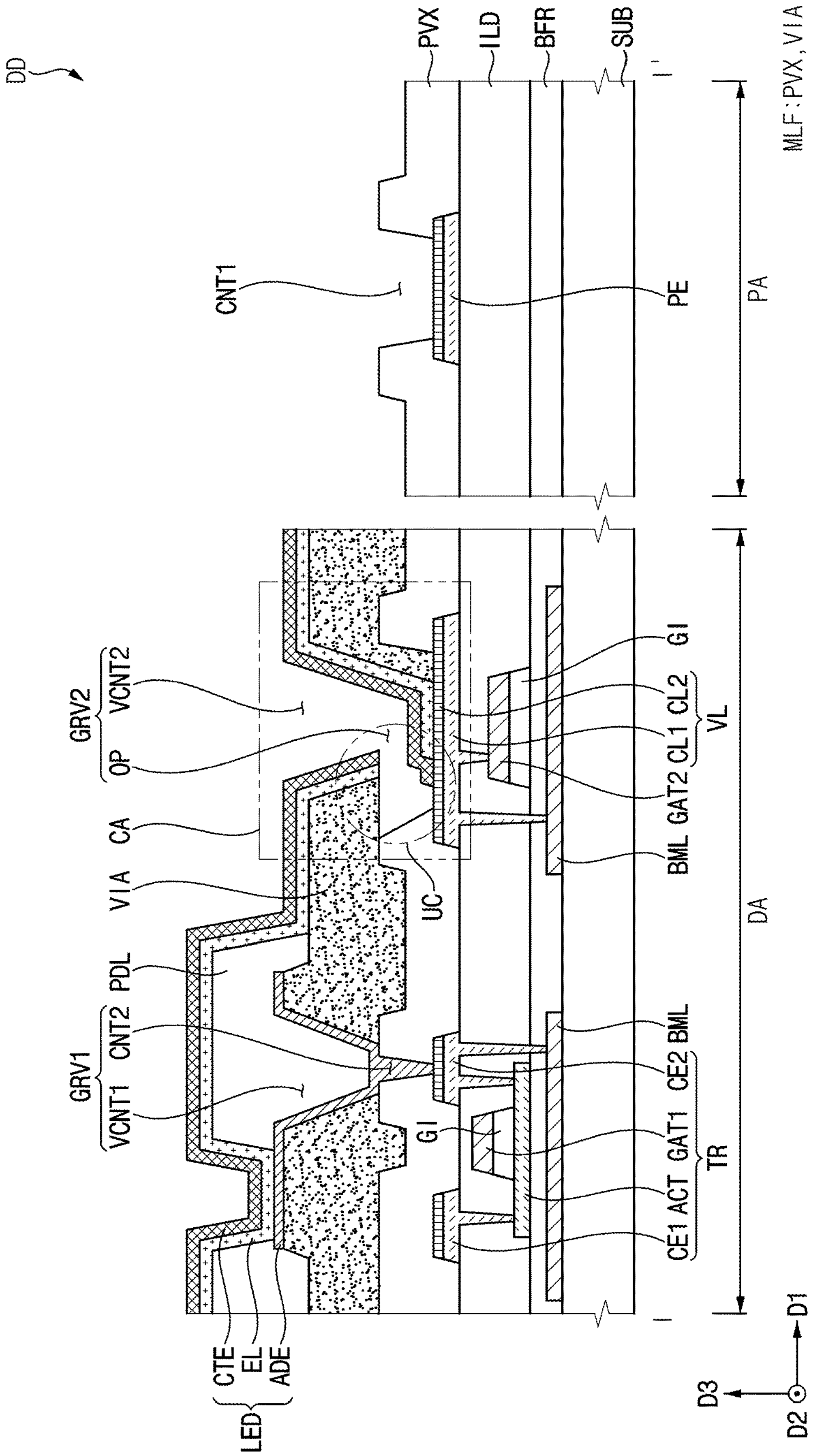
Figure 19:
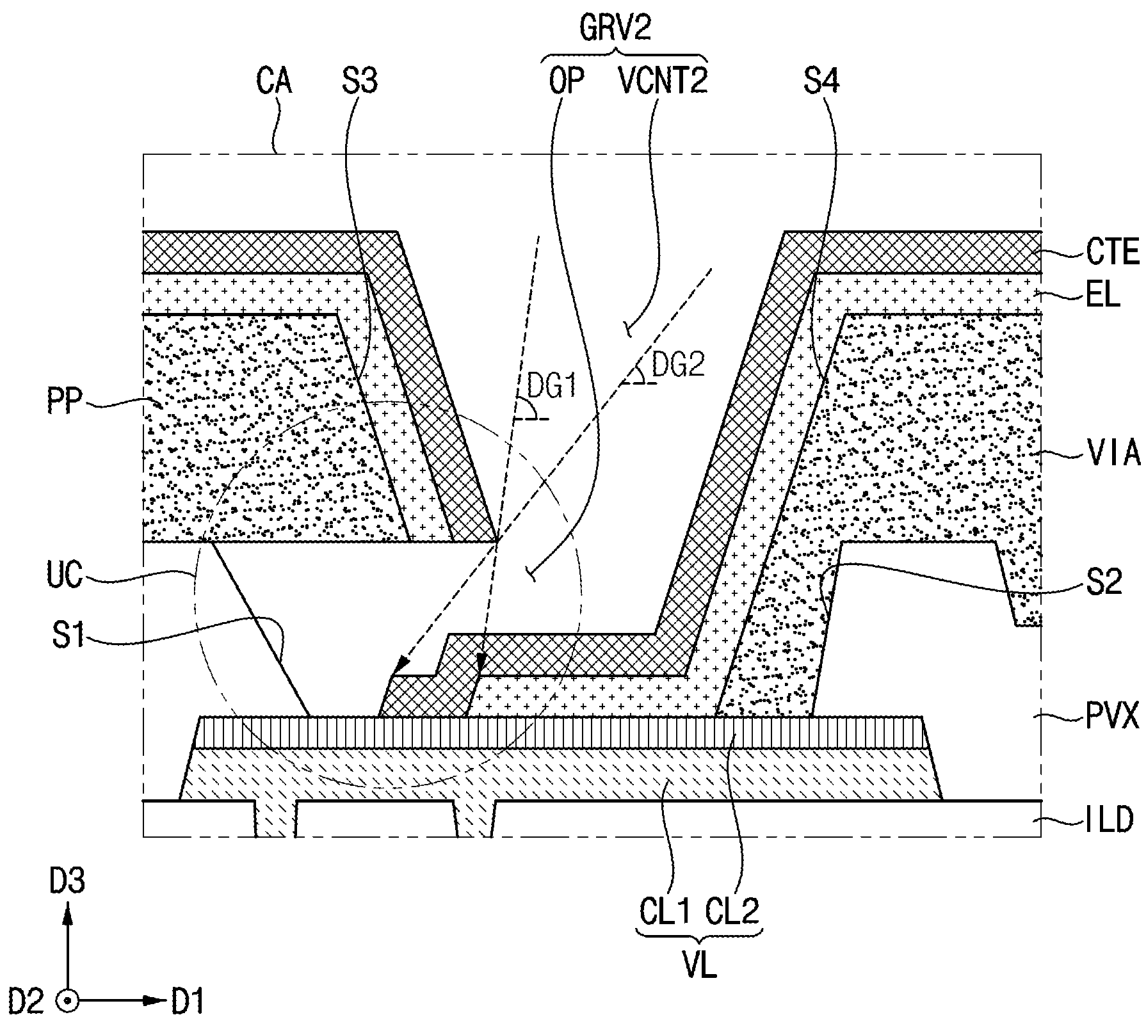

Referring to FIGS. 18 and 19, the common electrode CTE may be formed on the emission layer EL. The common electrode CTE may be formed on the whole surface of the display area DA of the display device DD.

As the emission layer EL is disconnected in the contact area CA by the protrusion PP, the common electrode CTE may be electrically connected to the power line VL in the contact area CA. For example, the common electrode CTE may contact the power line VL in the contact area CA. For example, the common electrode CTE may contact the upper surface of the power line VL.

As shown in FIG. 19, the common electrode CTE may be deposited at a second angle DG2. For example, the first angle DG1 may be greater than the second angle DG2 with respect to the common electrode CTE. In other words, the common electrode CTE may be deposited at a lower deposition angle than the emission layer EL. Accordingly, the common electrode CTE may cover the side surface of the emission layer EL.

In an embodiment, the common electrode CTE may be disconnected in the contact area CA by the protrusion PP of the via insulation layer VIA. In other words, the common electrode CTE may be disconnected by the undercut shape UC of the multilayer film MLF.

Thereafter, as shown in FIG. 4, the encapsulation layer TFE may be formed on the common electrode CTE. For example, the first inorganic encapsulation layer IEL1, the organic encapsulation layer OEL, and the third inorganic encapsulation layer IEL2 may be sequentially formed.

In an embodiment, the encapsulation layer TFE may be formed to fill the empty space of the second groove GRV2 of the multilayer film MLF. For example, the first inorganic encapsulation layer IEL1 may be formed along the profile of the common electrode CTE, and the organic encapsulation layer OEL may be formed to fill the empty space of the second groove GRV2 of the multilayer film MLF, and the second inorganic encapsulation layer IEL2 may be formed on the organic encapsulation layer OEL.

According to embodiments, the display device DD may include the power line VL, the passivation layer PVX, the via insulation layer VIA, and the common electrode CTE. In addition, the passivation layer PVX may have the opening OP exposing a portion of the power line VL in the contact area CA, and the via insulation layer VIA may have the second via contact hole VCNT2 connected to the opening OP. In addition, the via insulation layer VIA may have the protrusion PP protruding toward the center of the second via contact hole VCNT2.

Accordingly, the multilayer film MLF including the passivation layer PVX and the via insulation layer VIA may have the undercut shape UC. Accordingly, the common electrode CTE may be electrically connected to the power line VL in the contact area CA. Accordingly, a voltage drop of the common voltage ELVSS provided to the common electrode CTE may be prevented.

Figure 20:
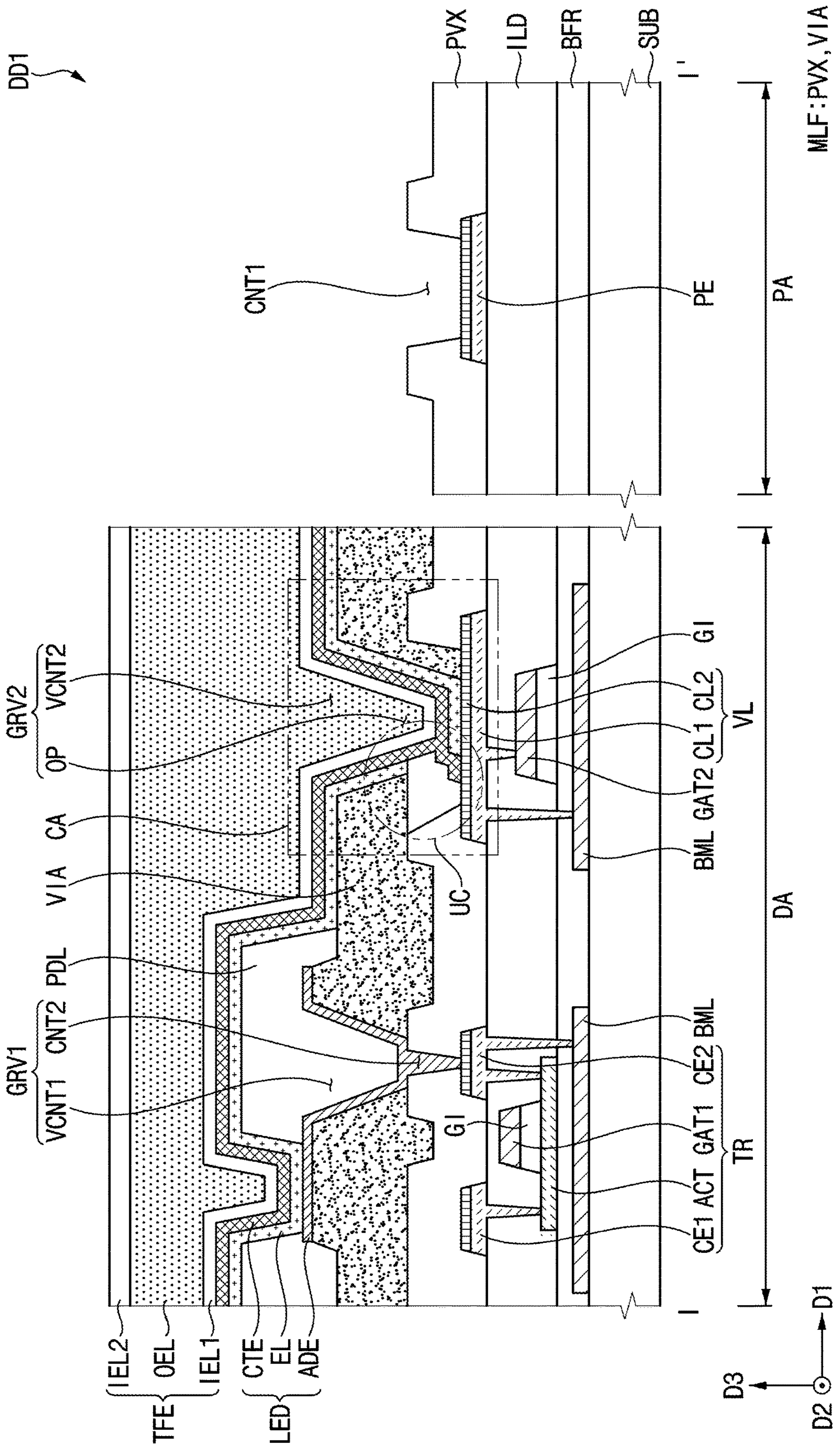
FIG. 20 is a cross-sectional view illustrating a display device according to another embodiment.

FIG. 20 is a cross-sectional view illustrating a display device according to another embodiment.

Referring to FIG. 20, the display device DD1 according to another embodiment may be substantially the same as the display device DD described with reference to FIG. 4, except that the common electrode CTE is entirely connected to the contact area CA.

In an embodiment, the common electrode CTE may be formed on the whole surface of the display area DA of the display device DD1 and connected to the contact area CA entirely. In other words, the common electrode CTE may not be disconnected by the undercut shape UC in the contact area CA. In addition, although not shown, when the common electrode CTE is connected entirely in the contact area CA, an organic material or the like may be filled in the space between the power line VL and the via insulation layer VIA due to the undercut shape UC.

Figure 21:
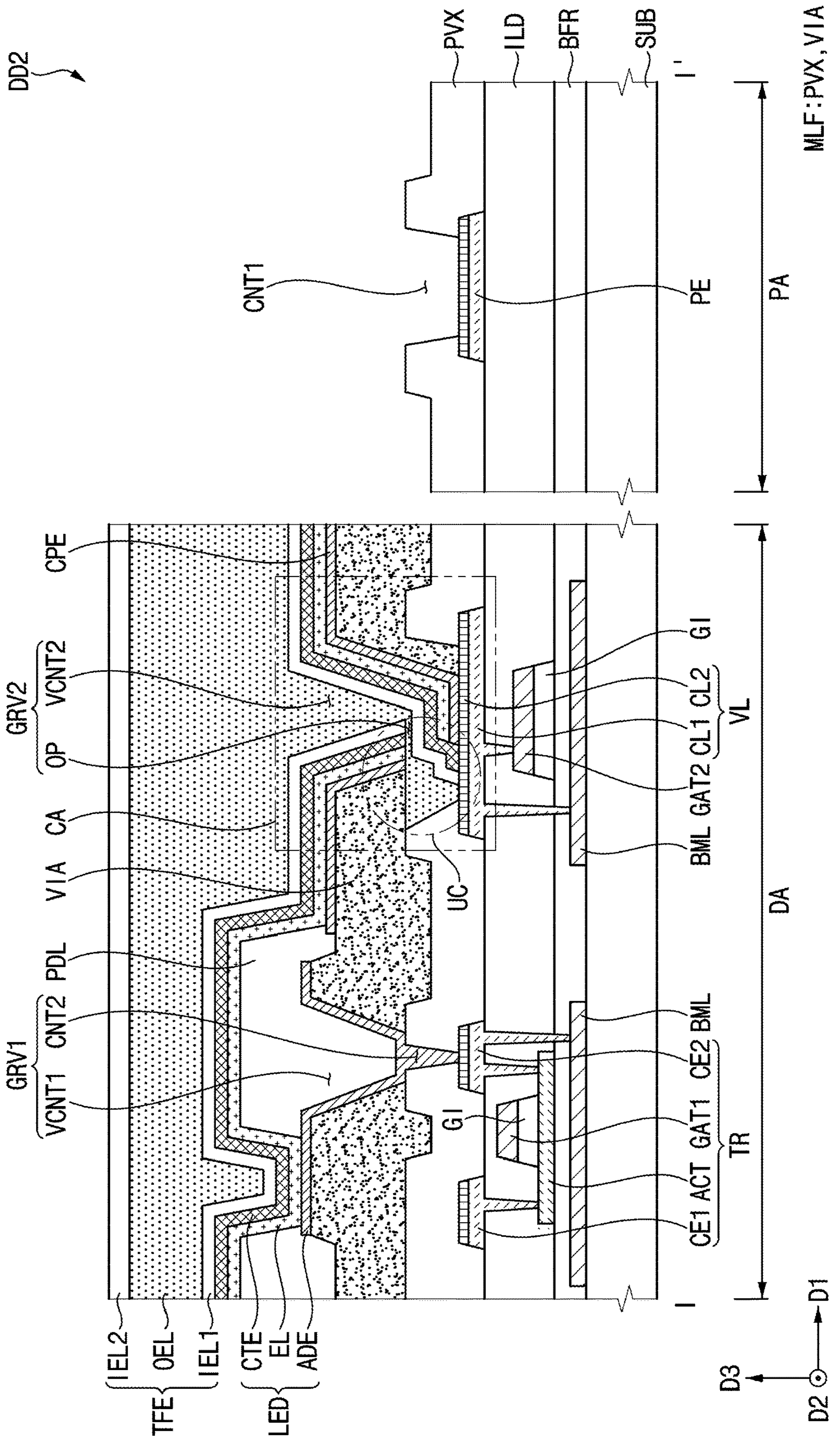
FIG. 21 is a cross-sectional view illustrating a display device according to still another embodiment.

FIG. 21 is a cross-sectional view illustrating a display device according to still another embodiment.

Referring to FIG. 21, the display device DD2 according to still another embodiment may further include a capping electrode CPE. However, the display device DD2 may be substantially the same as the display device DD described with reference to FIG. 4 except for the capping electrode CPE.

In an embodiment, the display device DD2 may further include the capping electrode CPE which contacts the power line VL.

In an embodiment, the capping electrode CPE may be formed together with the pixel electrode ADE by the same process. In other words, the capping electrode CPE may be disposed on the same layer as the pixel electrode ADE. In other words, the capping electrode CPE may include the same material as the pixel electrode ADE.

For example, the capping electrode CPE may be formed of a metal, an alloy, a conductive metal oxide, a transparent conductive material, or the like. Examples of materials that can be used as the capping electrode (CPE) may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

In an embodiment, the capping electrode CPE may be disconnected in the contact area CA by the protrusion (see FIG. 5) of the via insulation layer VIA. In other words, the capping electrode CPE may be disconnected by the undercut shape UC in the contact area CA.

In an embodiment, the common electrode CTE may cover both a side surface of the capping electrode CPE and the side surface of the emission layer EL.

Figure 22:
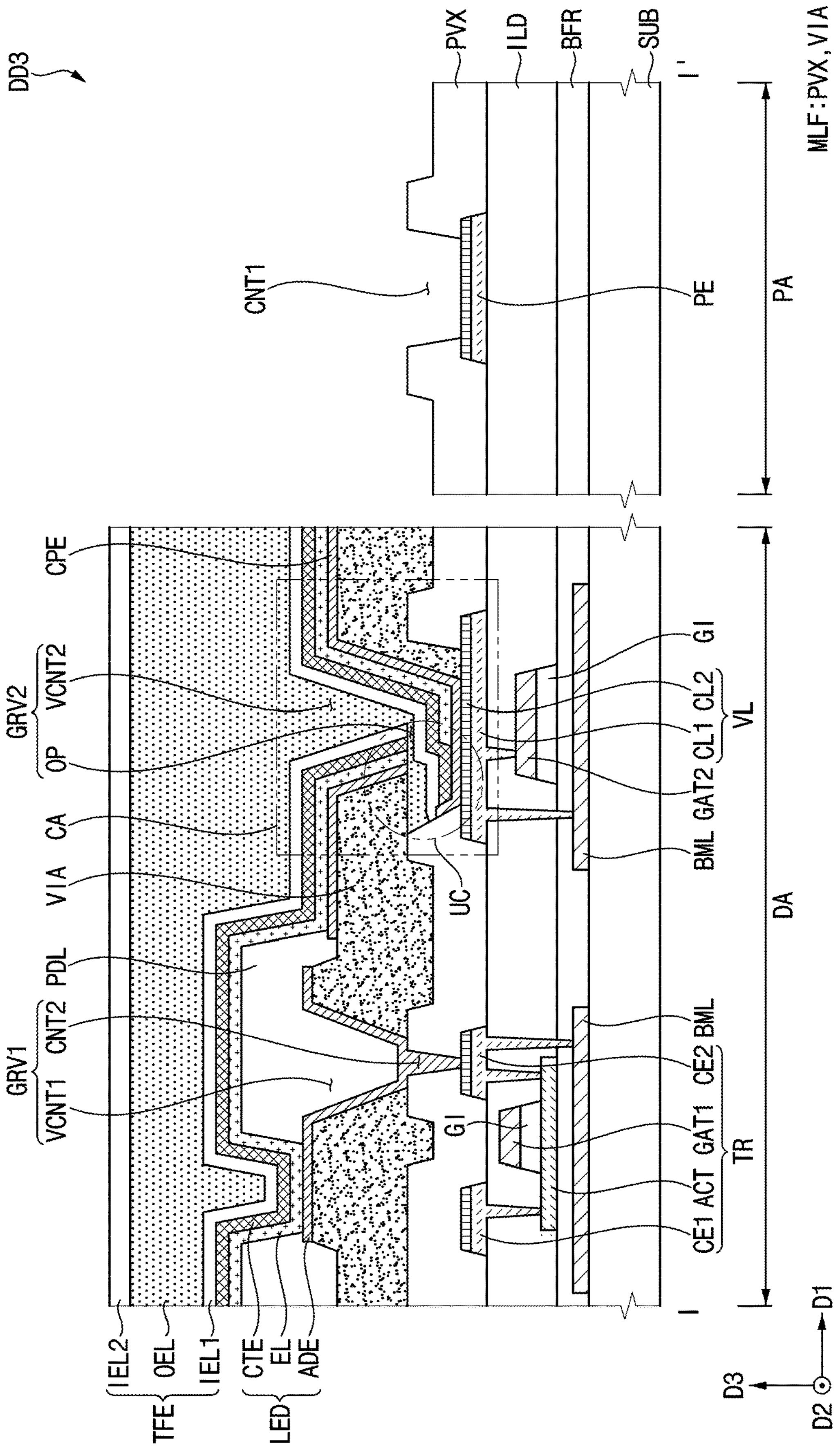
FIG. 22 is a cross-sectional view illustrating a display device according to still another embodiment.
Figure 23:
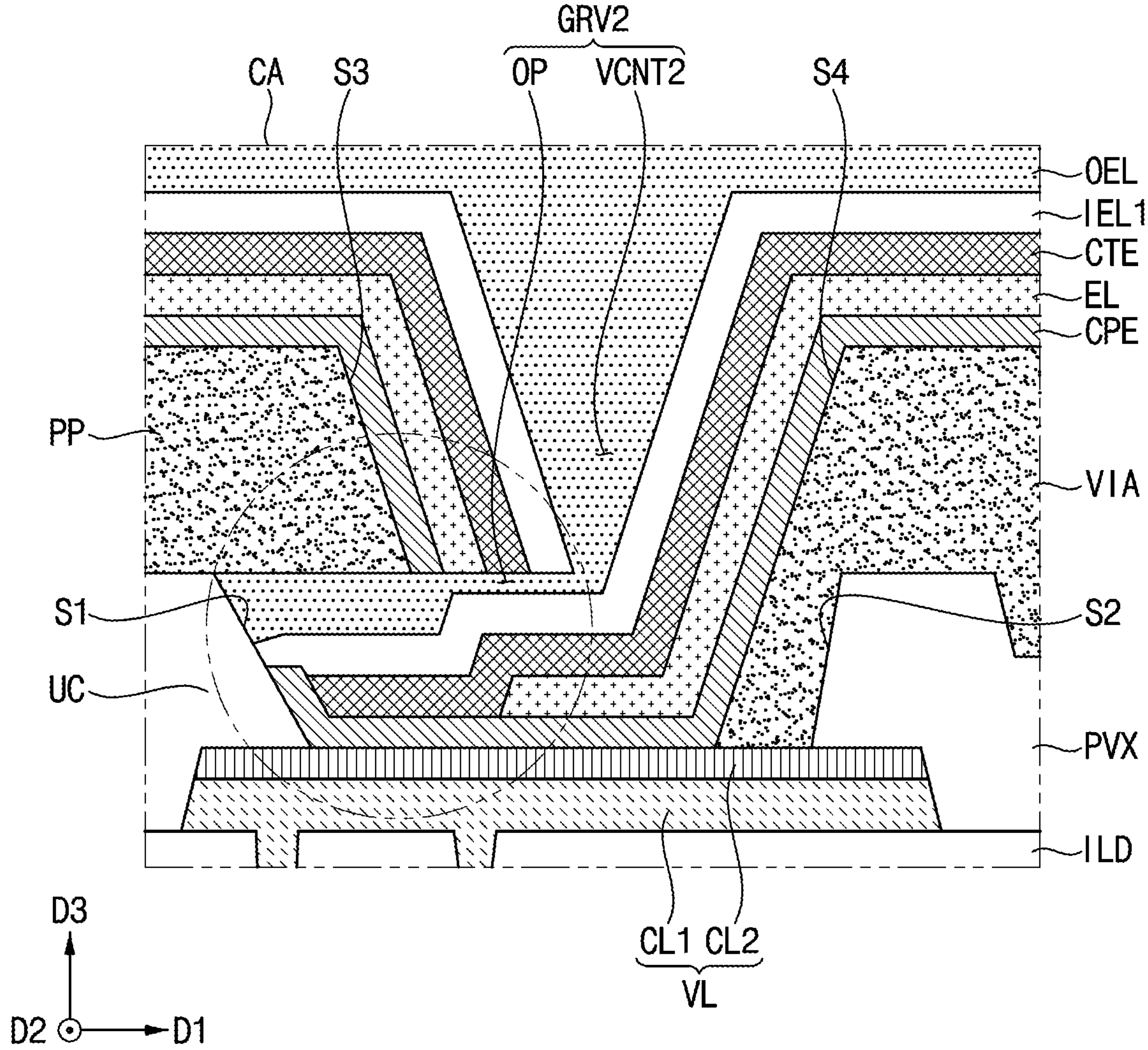
FIG. 23 is an enlarged view of the contact area of FIG. 22.

FIG. 22 is a cross-sectional view illustrating a display device according to still another embodiment, and FIG. 23 is an enlarged view of the contact area of FIG. 22.

Referring to FIG. 22, in the display device DD3 according to still another embodiment may be substantially the same as the display device described with reference to FIG. 4, except that the capping electrode CPE contacts the first side surface S1 of the opening OP.

Referring further to FIG. 23, in an embodiment, the display device DD3 may include the capping electrode CPE, and the capping electrode CPE may extend to the first side surface S1 of the opening OP to be in contact with the first side surface S1. For example, the capping electrode CPE may pass through the upper surface of the power line VL and extend to the first side surface S1 of the opening OP. In this case, the common electrode CTE may also extend to the first side surface S1 of the opening OP through an upper surface of the capping electrode CPE on the power line VL. However, even when the common electrode CTE extends to the first side surface S1 of the opening OP, it may not contact the first side surface S1 of the opening OP due to the capping electrode CPE. Therefore, even when the common electrode CTE extends to the first side surface S1 of the opening OP, the capping electrode CPE may electrically connect the power line VL and the common electrode CTE.

The present disclosure should not be construed as being limited to the embodiments set forth herein. Rather, these embodiments are provided so that this disclosure will be thorough and complete and will fully convey the concept of the present disclosure to those skilled in the art.

While the present disclosure has been particularly shown and described with reference to embodiments thereof, it will be understood by those of ordinary skill in the art that various changes in form and details may be made therein without departing from the spirit or scope of the present disclosure as defined by the following claims.

What is claimed is:

1. A display device comprising:

a substrate including a display area and a contact area located in the display area;

a power line disposed in the display area on the substrate and overlapping the contact area;

a passivation layer disposed on the substrate and the power line, and an opening exposing at least a portion of an upper surface of the power line in the contact area defined in the passivation layer;

a via insulation layer disposed on the passivation layer, including a via contact hole connected to the opening in the contact area, and including a protrusion protruding toward a center of the via contact hole, and a common electrode disposed on the via insulation layer and the power line and directly electrically connected to the power line in the contact area.

2. The display device of claim 1, wherein a multilayer film including the passivation layer and the via insulation layer has an undercut shape in the contact area by a first side surface of the opening and the protrusion.

3. The display device of claim 2, wherein a portion of the via insulation layer extends to an inside of the opening to cover the second side surface of the opening opposite to the first side surface.

4. The display device of claim 3, wherein a first inclination angle of the first side surface with respect to the upper surface of the power line is smaller than a second inclination angle of the second side surface with respect to the upper surface of the power line, and wherein a third inclination angle of a side surface of the via insulation layer with respect to the upper surface of the power line is smaller than the second inclination angle.

5. The display device of claim 1, wherein the passivation layer includes an inorganic insulation material, and the via insulation layer includes an organic insulation material.

6. The display device of claim 1, wherein a length of the protrusion toward the center of the via contact hole is about 0.1 micrometers to about 5.0 micrometers.

7. The display device of claim 1, wherein the power line includes a first conductive layer and a second conductive layer disposed on the first conductive layer, wherein the first conductive layer includes at least one selected from copper (Cu) and aluminum (Al), and wherein the second conductive layer includes at least one selected from transparent conductive oxide, titanium (Ti), and molybdenum (Mo).

8. The display device of claim 1, wherein the common electrode is discontinued in the contact area by the protrusion.

9. The display device of claim 1, wherein the common electrode is connected entirely in the contact area.

10. The display device of claim 1, further comprising an emission layer discontinued in the contact area by the protrusion in the contact area.

11. The display device of claim 10, wherein a thickness of the emission layer is smaller than or equal to a thickness of the passivation layer.

12. The display device of claim 10, wherein the common electrode covers a side surface of the emission layer.

13. The display device of claim 1, further comprising:

a transistor disposed in the display area on the substrate;

a pixel electrode disposed on the transistor and electrically connected to the transistor; and a capping electrode discontinued in the contact area by the protrusion and disposed on a same layer as the pixel electrode, wherein an upper surface of the via insulation layer includes a first portion overlapping the pixel electrode and a second portion spaced apart from the pixel electrode, and wherein a height of the first portion from an upper surface of the substrate is greater than a height of the second portion from the upper surface of the substrate.

14. The display device of claim 1, further comprising a pad electrode disposed in a pad area located on one side of the display area on the substrate and disposed on a same layer as the power line, wherein the passivation layer exposes at least a portion of an upper surface of the pad electrode.

15. The display device of claim 1, further comprising an encapsulation layer disposed on the common electrode and including an inorganic encapsulation layer and an organic encapsulation layer, wherein the organic encapsulation layer is disposed to fill an empty space between the power line and the protrusion.

16. A display device comprising:

a substrate including a display area and a contact area located in the display area;

a power line disposed in the display area on the substrate and overlapping the contact area; and a multilayer film disposed on the substrate and the power line and exposing at least a portion of an upper surface of the power line in the contact area, wherein the multilayer film includes:

a passivation layer, and an opening exposing at least a portion of the upper surface of the power line in the contact area defined in the passivation layer; and a via insulation layer disposed on the passivation layer, including a via contact hole connected to the opening in the contact area, and including a protrusion protruding toward a center of the via contact hole, and wherein the multilayer film includes an undercut shape in the contact area by a first side surface of the opening and the protrusion, wherein a length of the protrusion toward the center of the via contact hole is about 0.1 micrometers to about 5.0 micrometers.

17. The display device of claim 16, wherein a portion of the via insulation layer extends to an inside of the opening to cover the second side surface of the opening opposite to the first side surface.

18. The display device of claim 17, wherein a first inclination angle of the first side surface with respect to the upper surface of the power line is smaller than a second inclination angle of the second side surface with respect to the upper surface of the power line.

19. The display device of claim 18, wherein a third inclination angle of a side surface of the via insulation layer with respect to the upper surface of the power line is smaller than the second inclination angle.

20. An electronic device comprising:

a display device configured to display an image based on an input image data and a control signal; and a host processor configured to provide the input image data and the control signal to the display device, wherein the display device including:

a substrate including a display area and a contact area located in the display area;

a power line disposed in the display area on the substrate and overlapping the contact area;

a passivation layer disposed on the substrate and the power line, and an opening exposing at least a portion of an upper surface of the power line in the contact area defined in the passivation layer;

a via insulation layer disposed on the passivation layer, including a via contact hole connected to the opening in the contact area, and including a protrusion protruding toward a center of the via contact hole, and a common electrode disposed on the via insulation layer and the power line and directly electrically connected to the power line in the contact area.

* * * * *